(12) United States Patent
Kimura

(10) Patent No.: US 9,041,299 B2
(45) Date of Patent: May 26, 2015

(54) LIGHT EMITTING DEVICE AND ELECTRONIC EQUIPMENT USING THE SAME

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/221,400

(22) Filed: Mar. 21, 2014

(65) Prior Publication Data

US 2014/0204074 A1 Jul. 24, 2014

Related U.S. Application Data

(60) Continuation of application No. 13/157,359, filed on Jun. 10, 2011, now Pat. No. 8,680,772, which is a continuation of application No. 10/787,957, filed on Feb. 27, 2004, now Pat. No. 7,960,917, which is a division of application No. 10/072,702, filed on Feb. 7, 2002, now Pat. No. 6,710,548.

(30) Foreign Application Priority Data

Feb. 8, 2001 (JP) ................................. 2001-032188

(51) Int. Cl.
*G09G 3/10* (2006.01)
*G09G 3/14* (2006.01)
(Continued)

(52) U.S. Cl.
CPC ................ *G09G 3/14* (2013.01); *G09G 3/2022* (2013.01); *G09G 3/3233* (2013.01);
(Continued)

(58) Field of Classification Search
USPC ........ 315/169.1, 169.2, 169.3, 291, 299, 308; 345/76, 77, 78, 82, 83, 211, 212
See application file for complete search history.

(56) References Cited

U.S. PATENT DOCUMENTS 5,659,328 A 8/1997 Todokoro
5,910,792 A 6/1999 Hansen
(Continued)

FOREIGN PATENT DOCUMENTS

EP 0 661 726 A1 7/1995
EP 0 923 067 A1 6/1999
(Continued)

OTHER PUBLICATIONS

M. A. Baldo et al., "Highly Efficient Phosphorescent Emission from Organic Electroluminescent Devices", Nature, vol. 395, Sep. 10, 1998, pp. 151-154.
(Continued)

*Primary Examiner* — Thuy Vinh Tran
(74) *Attorney, Agent, or Firm* — Fish & Richardson P.C.

(57) ABSTRACT

A light emitting device is provided which is capable of displaying in desired colors stably by controlling a change in luminance of OLED when an organic light emitting layer is degraded or there is a change in temperature of the surroundings. A reference value for the amount of current flowing into a pixel portion is calculated from data of a video signal. Then, the pixel portion displays an image in accordance with the data of the video signal and the drive current at the time is measured for all of OLEDs in the pixel portion. The two voltage values supplied from a variable power supply to the pixel portion are corrected such that the measured drive current approaches the reference value. With the above structure, lowering of luminance which accompanies degradation of an organic light emitting layer is prevented and a clear image can be displayed as a result.

18 Claims, 24 Drawing Sheets

(51) Int. Cl.
  *G09G 3/32* (2006.01)
  *G09G 3/20* (2006.01)
  *H01L 27/32* (2006.01)

(52) U.S. Cl.
  CPC ........... *G09G 3/3266* (2013.01); *G09G 3/3275* (2013.01); *G09G 2300/0842* (2013.01); *G09G 2300/0866* (2013.01); *G09G 2320/0223* (2013.01); *G09G 2320/0242* (2013.01); *G09G 2320/0285* (2013.01); *G09G 2320/0295* (2013.01); *G09G 2320/043* (2013.01); *G09G 2330/02* (2013.01); *H01L 27/3244* (2013.01); *H01L 27/3295* (2013.01)

(56) References Cited

U.S. PATENT DOCUMENTS

| | | | |
|---|---|---|---|
| 5,949,194 | A | 9/1999 | Kawakami |
| 6,211,720 | B1 | 4/2001 | Matsuzawa |
| 6,335,713 | B1 | 1/2002 | Imai |
| 6,384,806 | B1 | 5/2002 | Matsueda |
| 6,414,661 | B1 | 7/2002 | Shen |
| 6,424,326 | B2 | 7/2002 | Yamazaki |
| 6,445,367 | B1 | 9/2002 | Suzuki |
| 6,473,065 | B1 | 10/2002 | Fan |
| 6,498,592 | B1 | 12/2002 | Matthies |
| 6,501,230 | B1 | 12/2002 | Feldman |
| 6,518,962 | B2 | 2/2003 | Kimura |
| 6,788,003 | B2 * | 9/2004 | Inukai et al. ............... 315/169.3 |
| 7,042,427 | B2 | 5/2006 | Inukai |
| 7,218,297 | B2 * | 5/2007 | Inukai et al. ................... 345/82 |
| 2001/0033252 | A1 | 10/2001 | Yamazaki |
| 2002/0101395 | A1 | 8/2002 | Inukai |
| 2002/0125831 | A1 | 9/2002 | Inukai |
| 2002/0180721 | A1 | 12/2002 | Kimura |
| 2003/0063081 | A1 | 4/2003 | Kimura |

FOREIGN PATENT DOCUMENTS

| | | |
|---|---|---|
| EP | 1 148 466 A2 | 10/2001 |
| EP | 1 227 466 A2 | 7/2002 |
| EP | 1 227 467 A2 | 7/2002 |
| JP | 02-162915 A | 6/1990 |
| JP | 03-060877 A | 3/1991 |
| JP | 03-174186 A | 7/1991 |
| JP | 03-296666 A | 12/1991 |
| JP | 04-027768 A | 1/1992 |
| JP | 08-160883 A | 6/1996 |
| JP | 09-190160 A | 7/1997 |
| JP | 09-258687 A | 10/1997 |
| JP | 09-305145 A | 11/1997 |
| JP | 10-319910 A | 12/1998 |
| JP | 11-272242 A | 10/1999 |
| JP | 2000-056732 A | 2/2000 |
| JP | 2000-187466 A | 7/2000 |
| JP | 2000-242217 A | 9/2000 |
| JP | 2001-202059 A | 7/2001 |
| JP | 2001-324955 A | 11/2001 |
| TW | 397965 B | 7/2000 |
| WO | WO 98/40871 A1 | 9/1998 |
| WO | WO 99/24961 A1 | 5/1999 |

OTHER PUBLICATIONS

M. A. Baldo et al., "Very High-Efficiency Green Organic Light-Emitting Devices Based on Electrophosphorescence", Applied Physics Letters, vol. 75, No. 1, Jul. 5, 1999, pp. 4-6.

Tsutsui et al., "Electroluminescence in Organic Thin Films", Photochemical Processes in Organized Molecular Systems, 1991, pp. 437-450.

Tsutsui et al., "High Quantum Efficiency in Organic Light-Emitting Devices with Iridium-Complex as a Triplet Emissive Center", Japanese Journal of Applied Physics, vol. 38, Part 2, No. 12B, Dec. 15, 1999, pp. L1502-L1504.

Search Report (Application No. 02002875.9 EP5501 Dated Apr. 3, 2007).

* cited by examiner

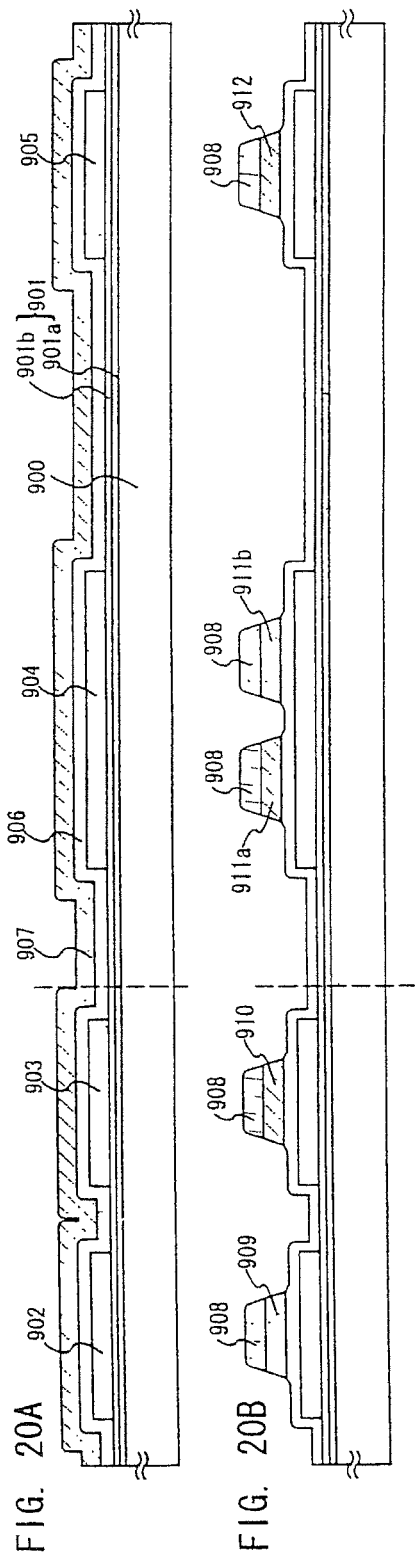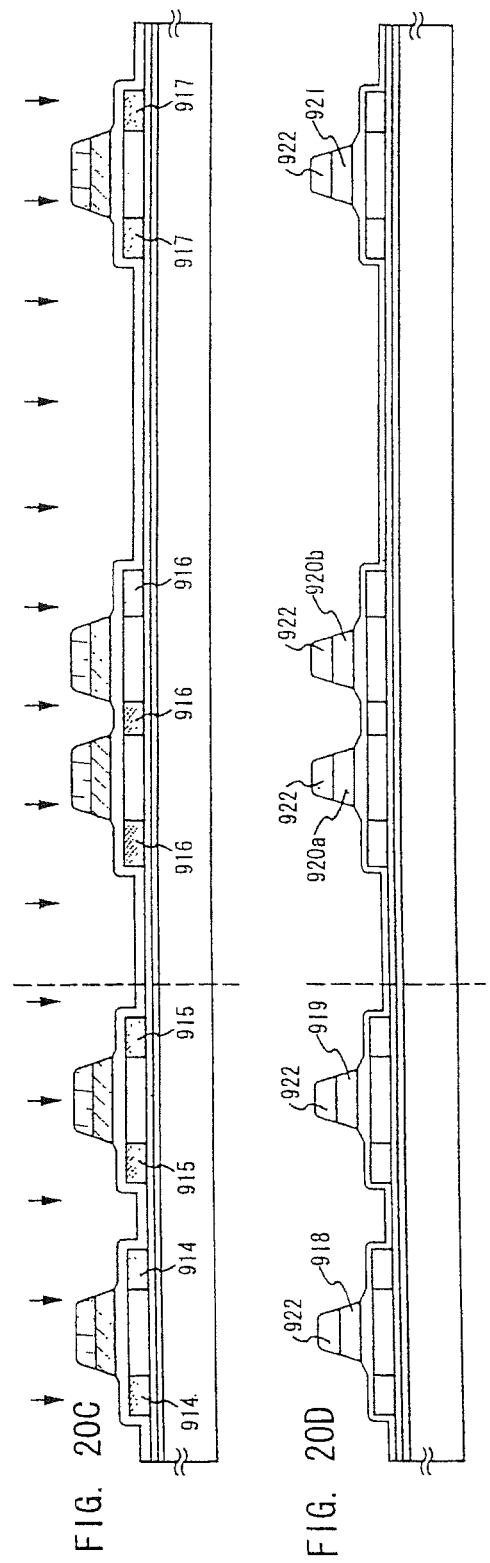

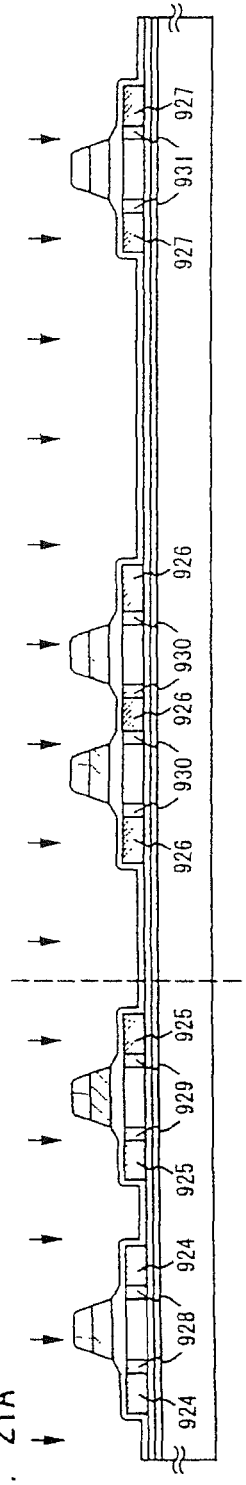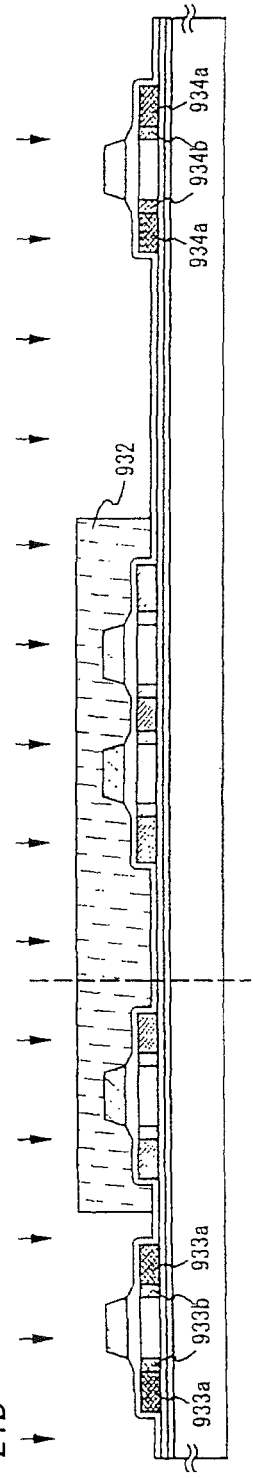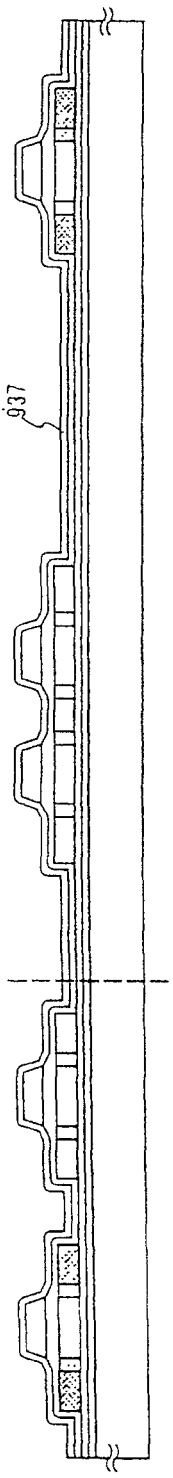

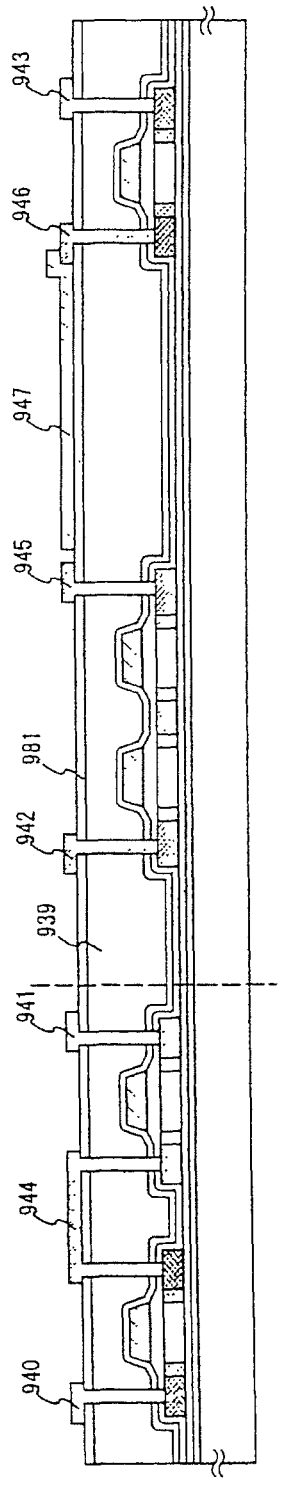
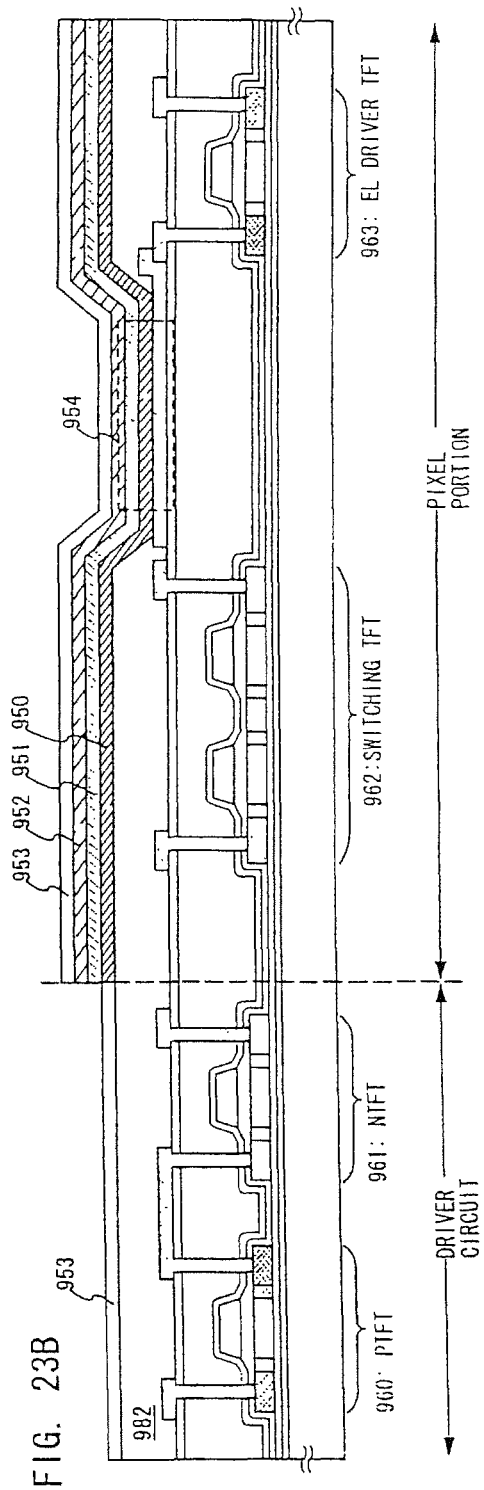
FIG. 23A
FIG. 23B

FIG. 24A
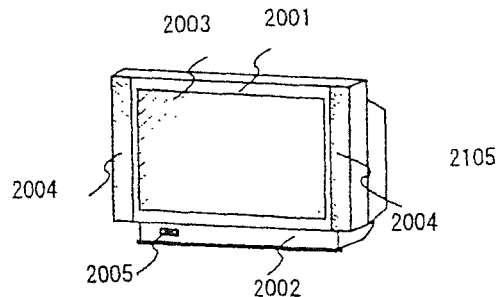
FIG. 24B
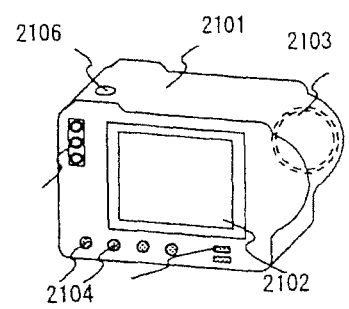
FIG. 24C
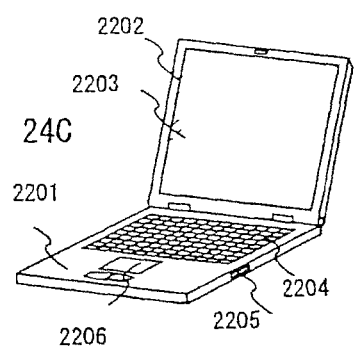
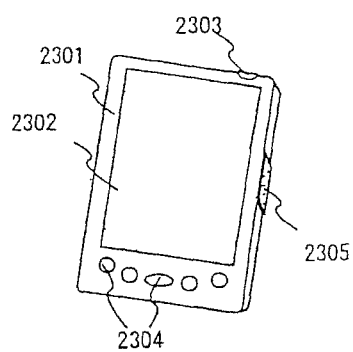
FIG. 24D
FIG. 24E
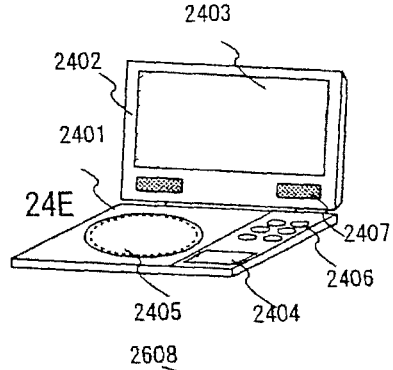
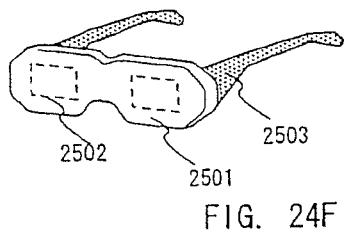
FIG. 24F
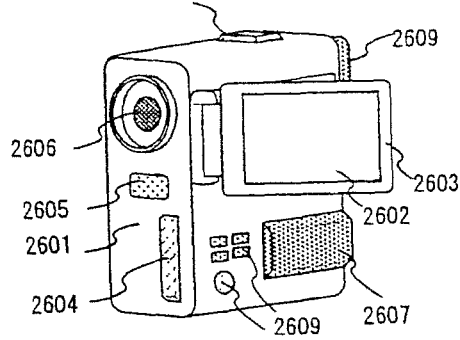
FIG. 24G
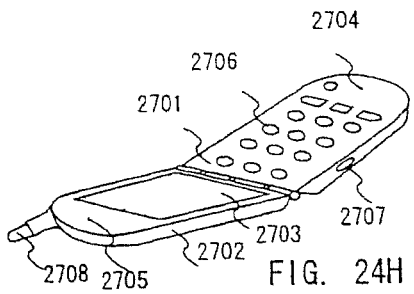
FIG. 24H

LIGHT EMITTING DEVICE AND ELECTRONIC EQUIPMENT USING THE SAME

CROSS-REFERENCE TO RELATED APPLICATIONS

This application is a continuation of U.S. application Ser. No. 13/157,359, filed Jun. 10, 2011, now U.S. Pat. No. 8,680,772, which is a continuation of U.S. application Ser. No. 10/787,957, filed Feb. 27, 2004, now U.S. Pat. No. 7,960,917, which is a divisional of U.S. application Ser. No. 10/072,702, filed Feb. 7, 2002, now U.S. Pat. No. 6,710,548, which claims the benefit of a foreign priority application filed in Japan as Serial No. 2001-032188 on Feb. 8, 2001, all of which are incorporated by reference.

BACKGROUND OF THE INVENTION

1. Field of the Invention

The present invention relates to an OLED (organic light emitting device) panel obtained by forming an OLED on a substrate and sealing the OLED between the substrate and a cover member. The invention also relates to an OLED module in which an IC including a controller, or the like, is mounted to the OLED panel. In this specification, 'light emitting device' is the generic term for the OLED panel and for the OLED module. Electronic equipment using the light emitting device is also included in the present invention.

2. Description of the Related Art

An OLED emits light by itself, and thus, has high visibility. The OLED does is not need a backlight necessary for a liquid crystal display device (LCD), which is suitable for a reduction of a light emitting device in thickness. Also, the OLED has no limitation on a viewing angle. Therefore, the light emitting device using the OLED has recently been attracting attention as a display device that substitutes for a CRT or the LCD.

The OLED includes a layer containing an organic compound in which luminescence generated by application of an electric field (electroluminescence) is obtained (organic light emitting material) (hereinafter, referred to as organic light emitting layer), an anode layer and a cathode layer. A light emission in returning to a base state from a singlet excitation state (fluorescence) and a light emission in returning to a base state from a triplet excitation state (phosphorescence) exist as the luminescence in the organic compound. The light emitting device of the present invention may use one or both of the above-described light emissions.

Note that, in this specification, all the layers provided between an anode and a cathode of the OLED are defined as the organic light emitting layers. The organic light emitting layers specifically include a light emitting layer, a hole injecting layer, an electron injecting layer, a hole transporting layer, an electron transporting layer and the like. The OLED basically has a structure in which an anode/a light emitting layer/a cathode are laminated in order. Besides this structure, the OLED may take a structure in which an anode/a hole injecting layer/a light emitting layer/a cathode are laminated in order or a structure in which an anode/a hole injecting layer/a light emitting layer/an electron transporting layer/a cathode are laminated in order.

The problem in putting a light emitting device into practice is lowering in luminance of OLED which accompanies degradation of an organic light emitting material.

Organic light emitting materials are weak against moisture, oxygen, light, and heat, which accelerate degradation of the organic light emitting materials. The rate of degradation of an organic light emitting material depends specifically on the structure of a device for driving the light emitting device, characteristics of the organic light emitting material, materials of electrodes, conditions in a manufacture process, how the light emitting device is driven, etc.

Even when the voltage applied to the organic light emitting layer is constant, the luminance of the OLED is lowered as the organic light emitting layer degrades, and an image to be displayed is therefore become unclearly. In this specification, a voltage applied to an organic light emitting layer from a pair of electrodes is called an OLED drive voltage (Ve1).

When an image is displayed in color by using three types of OLEDs that emit red (R) light, green (G) light, and blue (B) light, respectively, different organic materials are used to form organic light emitting layers of OLEDs of a plurality of colors. Accordingly, the rate of degradation of organic light emitting layer may vary between OLEDs of a plurality of colors. Then difference in luminance between OLEDs of a plurality of colors will be apparent as time passes, making it impossible for the light emitting device to display an image in desired colors.

SUMMARY OF THE INVENTION

The present invention has been made in view of solving the above, and an object of the present invention is therefore to provide a light emitting device capable of displaying a clear image in desired colors by controlling lowering of luminance of OLED when its organic light emitting layer is degraded.

The present inventors have taken notice of the fact that the luminance of OLED is lowered by degradation less when light is emitted with a current flow to an OLED kept constant than when light is emitted with the OLED drive voltage kept constant. In this specification, a current flowing into an OLED is called an OLED drive current (Ie1).

FIG. 2 shows changes in luminance of OLED when the OLED drive voltage is constant and when the OLED drive current is constant. As shown in FIG. 2, the luminance is lowered by degradation less when the OLED drive current is constant.

Therefore, the present inventors have devised a light emitting device in which the OLED drive current is kept constant through correction of OLED drive voltage when the OLED drive current is lowered by degradation.

Specifically, the light emitting device of the present invention has first means of measuring the OLED drive current, second means of calculating from a video signal an ideal OLED drive current value (reference value), third means of comparing the measured value with the reference value, and fourth means of correcting the OLED drive voltage to reduce the difference between the measured value and the reference value.

With the above structure, the present invention can keep the OLED drive current constant when the organic light emitting layer is degraded to prevent the luminance from lowering. As a result, the light emitting device of the present invention can display a clear image.

If the light emitting device is to display an image in color using three types of OLEDs that emit red (R) light, green (G) light, and blue (B) light, respectively, the OLED drive current may be measured for OLEDs of a plurality of colors separately to correct their respective OLED drive voltages. This structure makes it possible to keep the luminance of light of a plurality of colors balanced and display in desired colors when the rate of degradation of organic light emitting layer varies between OLEDs of a plurality of colors.

The temperature of organic compound layer is influenced by the outside temperature and heat generated by the OLED panel itself. Generally, the amount of current flowing in an OLED varies depending on the temperature. FIG. 3 shows a change in voltage-current characteristic of an OLED when the temperature of its organic light emitting layer is changed. With the voltage kept constant, the OLED drive current is increased as the temperature of the organic light emitting layer goes high. Since the OLED drive current is in proportion to the OLED luminance, the luminance of the OLED becomes higher as the OLED drive current becomes larger. In FIG. 2, when the voltage is constant, the luminance goes up and down in an about 24-hour cycle reflecting the temperature difference between day and night. However, the light emitting device of the present invention can keep the OLED drive current constant when there is a change in temperature of the organic light emitting layer by correcting the OLED drive voltage. Therefore the luminance can be kept constantly irrespective of temperature change and an increase in power consumption accompanying temperature rise can be prevented.

Generally, temperature change brings varying degrees of changes in OLED drive current to different types of organic light emitting materials and, therefore, in color display, the luminance could be changed by temperature change differently for OLEDs of a plurality of colors. However, the light emitting device of the present invention can keep the luminance constant irrespective of temperature change to thereby keep the luminance of light of a plurality of colors balanced. An image can thus be displayed in desired colors.

The light emitting device of the present invention is convenient because the OLED current can be measured without disturbing the display on the screen the viewer is viewing.

In a common light emitting device, the electric potential of a wiring line used to supply a current to pixels may be lowered as the wiring line becomes longer because of the resistance of the wiring line itself. This electric potential is lowered to widely varying degrees depending on an image to be displayed. When the ratio of higher gray scale pixels to all of the pixels that receive a current from the same wiring line is large, in particular, the current flowing through the wiring lines is increased in amount to make lower of electric potential noticeable. When the electric potential is lowered, a smaller voltage is applied to the OLED of each pixel to reduce the amount of current supplied to each pixel. Therefore, the amount of current supplied to one pixel is changed as well as the gray scale number thereof when the gray scale number of the other pixels that receive a current from the same wiring line as the one pixel is changed, making it impossible for the one pixel to keep a constant gray scale. In the light emitting device of the present invention, on the other hand, the measured value and the reference value are obtained to correct the OLED current each time a new image is displayed. Therefore, a desired gray scale number is obtained for every new image through correction.

BRIEF DESCRIPTION OF THE DRAWINGS

In the accompanying drawings:

FIGS. 20A to 20D are diagrams showing a method of manufacturing a light emitting device according to the present invention;

FIGS. 21A to 21C are diagrams showing a method of manufacturing a light emitting device according to the present invention;

FIGS. 23A and 23B are diagrams showing a method of manufacturing a light emitting device according to the present invention; and FIGS. 24A to 24H are diagrams showing electronic equipment using a light emitting device of the present invention.

DETAILED DESCRIPTION OF THE PREFERRED EMBODIMENTS

The structure of the present invention will be described below.

Figure 1:
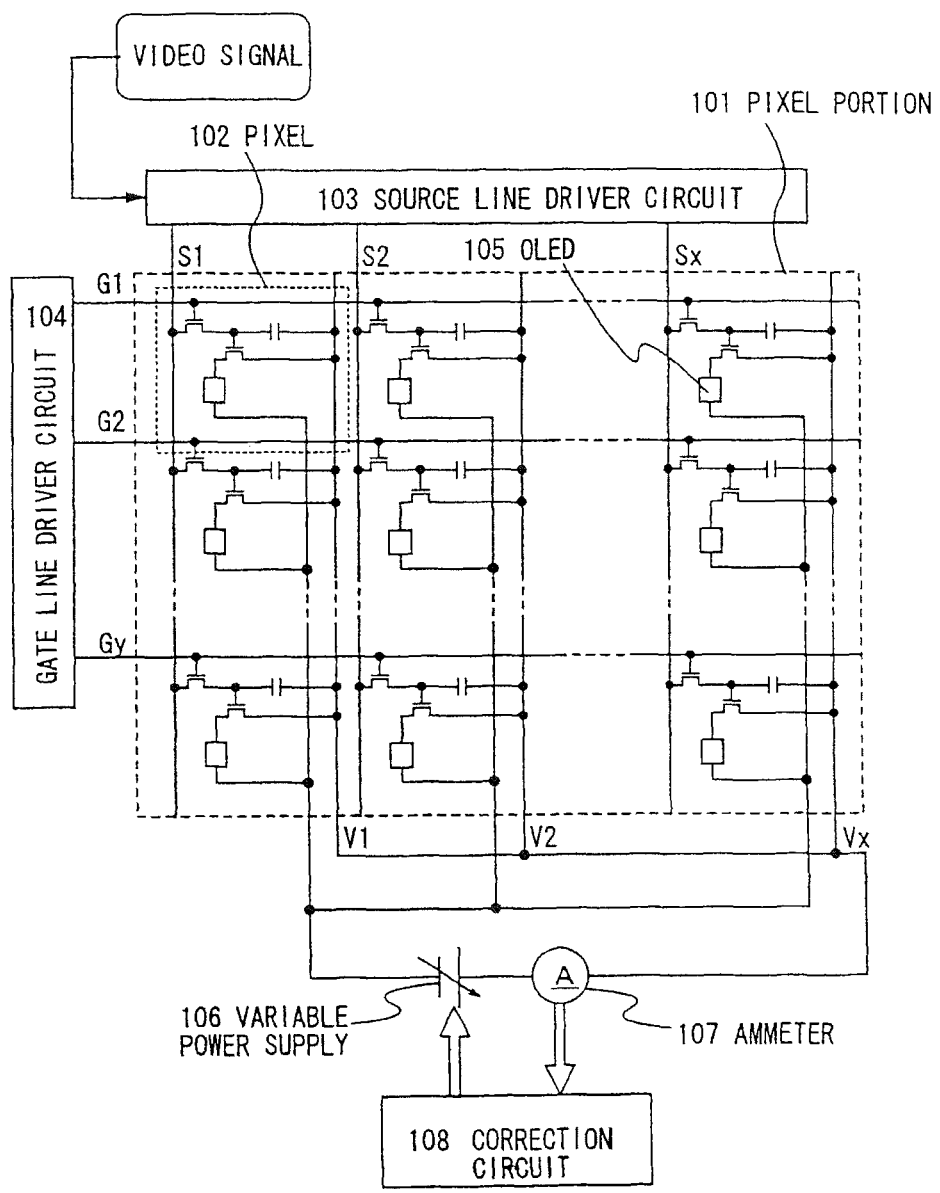
FIG. 1 is a block diagram of a light emitting device of the present invention.
Figure 2:
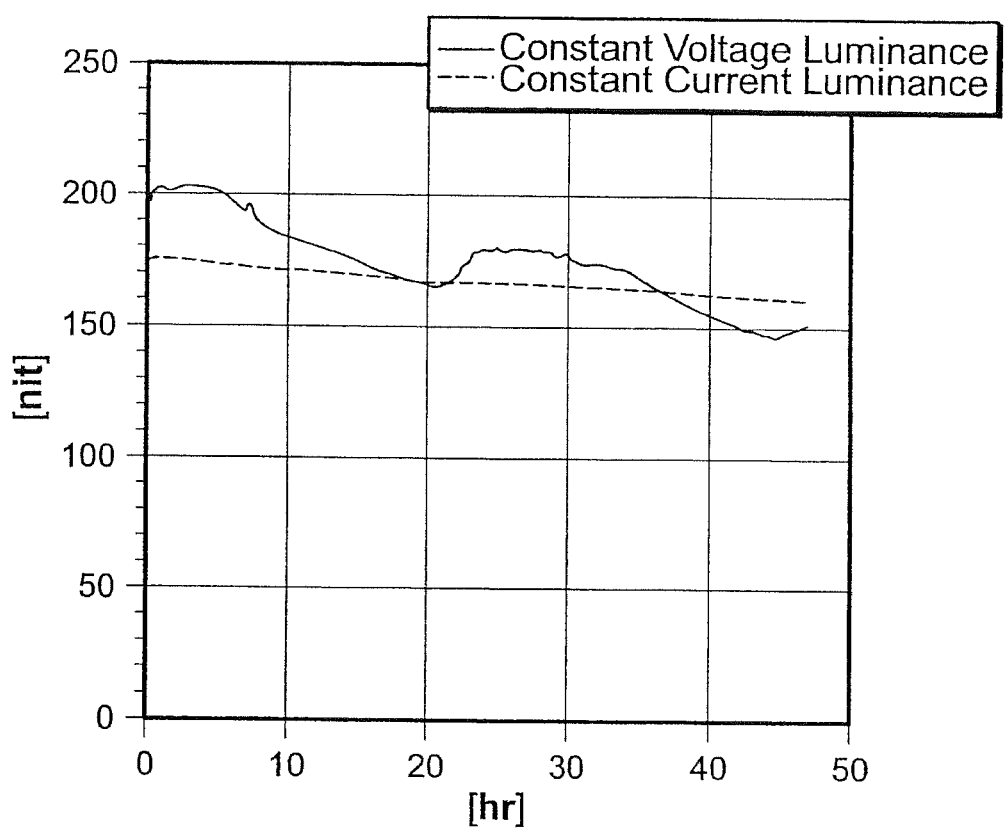
FIG. 2 shows a change in luminance due to degradation in constant current driving or in constant voltage driving.
Figure 3:
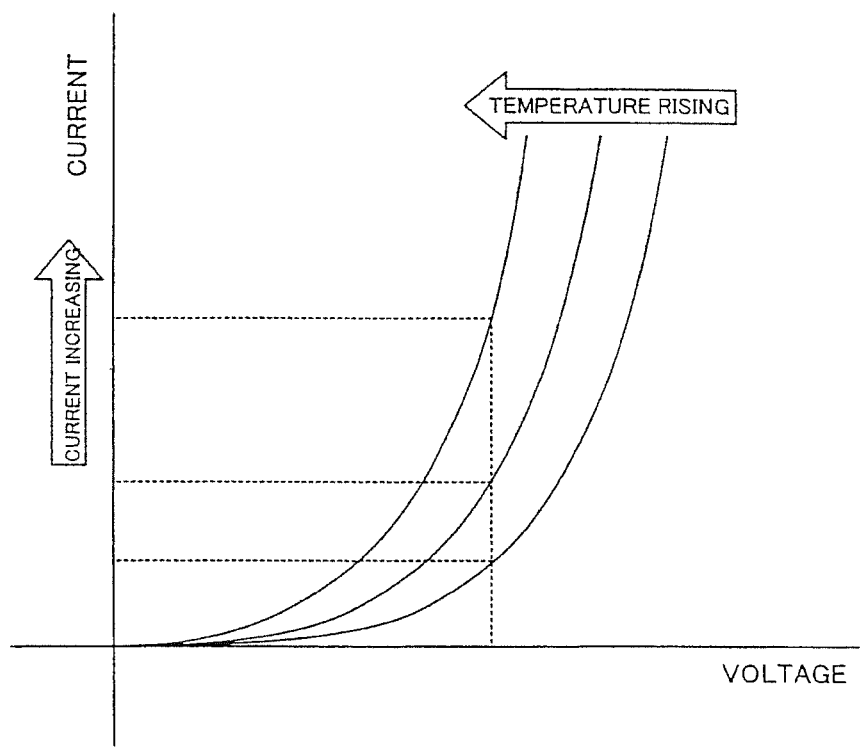
FIG. 3 shows a change in current due to a temperature change in an organic light emitting layer.

FIG. 1 is a block diagram showing the structure of an OLED panel of the present invention. Reference numeral 101 denotes a pixel portion. The pixel portion has a plurality of pixels 102 that form a matrix. Denoted by 103 and 104 are a source line driving circuit and a gate line driving circuit, respectively.

In FIG. 1, the source line driving circuit 103 and the gate line driving circuit 104 are formed on the same substrate on which the pixel portion 101 is formed. However, the present invention is not limited thereto. The source line driving circuit 103 and the gate line driving circuit 104 may be formed on a substrate that is connected through an FPC or other connectors to a substrate on which the pixel portion 101 is formed. Although the panel in FIG. 1 has one source line driving circuit 103 and one gate line driving circuit 104, the present invention is not limited thereto. How many source line driving circuits and gate line driving circuits are to be provided is within designer's discretion.

In FIG. 1, the pixel portion 101 is provided with source lines S1 to Sx, power supply lines V1 to Vx, and gate lines G1 to Gy. The number of source lines may not always match the number of power supply lines. The pixel portion may have other wiring lines than these wiring lines.

Each of the pixels 102 has an OLED 105. The OLED 105 has an anode and a cathode. In this specification, the cathode is called an opposite electrode (second electrode) when the anode is used as a pixel electrode (first electrode) and, when the cathode serves as the pixel electrode, the anode is called the opposite electrode.

The pixel electrode of the OLED 105 in each of the pixels 102 is connected to one of the power supply lines V1 to Vx through a single or plural TFTs. The power supply lines V1 to Vx are all connected to a variable power supply 106 through an ammeter 107. The opposite electrode of every OLED 105 is connected to the variable power supply 106. One or more elements may be used to connect the opposite electrode of the OLED 105 to the variable power supply 106.

If the panel is to display in color, correction of the OLED drive voltage may be made for OLEDs of a plurality of colors separately by providing one variable power supply and one ammeter for each color. In this case, the panel may have one correction circuit for each color or OLEDs of a plurality of colors may share a single correction circuit.

A variable power supply in this specification means a power supply for supplying a circuit or element with a current or voltage in varying amounts. In FIG. 1, the variable power supply 106 is connected such that the power supply line side is kept at the high electric potential (Vdd) whereas the opposite electrode side is kept at the low electric potential (Vss). However, the present invention is not limited thereto and other configurations are acceptable if the variable power supply 106 is connected in a manner that sets the current flowing into the OLED 105 to forward bias.

The power supply lines V1 to Vx are all connected to the ammeter 107 in series in FIG. 1. Alternatively, some of the power supply lines V1 to Vx may be connected through the ammeter 107 to the variable power supply 106 whereas the rest of the power supply lines are connected to the variable power supply 106 without interposing the ammeter 107.

The ammeter 107 may not always be placed between the variable power supply 106 and the power supply lines but may be placed between the variable power supply 106 and the opposite electrode. The ammeter used in the present invention can have any structure as long as it can sense a change in amount of current flowing through a wiring line.

Denoted by 108 is a correction circuit, which controls the voltage to be supplied to the opposite electrode and to the power supply lines V1 to Vx from the variable power supply 106 based on a current value measured by the ammeter 107 (measured value). A video signal is inputted to the correction circuit 108 and a reference value, which represents an ideal current value, is calculated from the video signal.

The ammeter 107, the variable power supply 106, and the correction circuit 108 may be formed on a substrate different from the one on which the pixel portion 101 is formed to be connected to the pixel portion 101 through a connector or the like. If possible, they may be formed on the same substrate on which the pixel portion 101 is formed.

Figure 4:
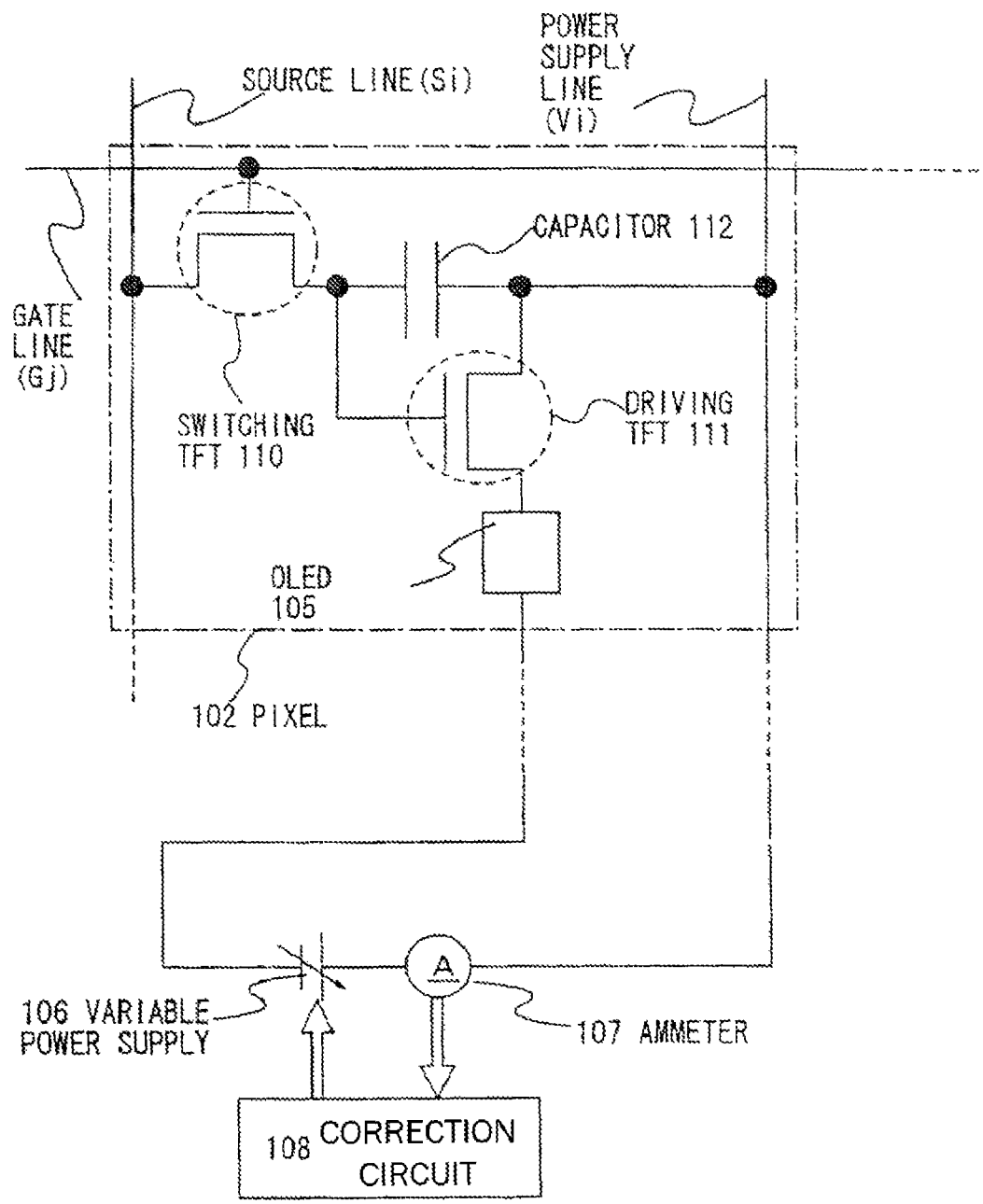
FIG. 4 is a pixel circuit diagram of a light emitting device of the present invention.

FIG. 4 shows a detailed structure of each pixel. The pixel shown in FIG. 4 has a source line Si (i=1 to x), a gate line Gj (j=1 to y), a power supply line Vi, a switching TFT 110, a driving TFT 111, a capacitor 112, and the OLED 105. The structure of the pixel shown in FIG. 4 is merely an example, and the number of wiring lines and elements of the pixel, types thereof, and the way they are connected are not limited to those shown in FIG. 4. The light emitting device of the present invention can have any pixel as long as it is structured to allow the variable power supply 106 to control the OLED drive voltage of the OLED in each pixel.

In FIG. 4, a gate electrode of the switching TFT 110 is connected to the gate line Gj. The switching TFT 110 has a source region and a drain region one of which is connected to the source line Si and the other of which is connected to a gate electrode of the driving TFT 111. The driving TFT 111 has a source region and a drain region one of which is connected to the power supply line Vi and the other of which is connected to the pixel electrode of the OLED 105. The capacitor 112 is formed between the gate electrode of the driving TFT 111 and the power supply line Vi.

In the pixel shown in FIG. 4, the electric potential of the gate line Gj is controlled by the gate line driving circuit 104, and a video signal is inputted to the source line Si by the source line driving circuit 103. When the switching TFT 110 is turned ON, the video signal inputted to the source line Si is inputted to the gate electrode of the driving TFT 111 through the switching TFT 110. As the driving TFT 111 is turned ON by the video signal, the OLED 105, receiving the OLED voltage applied between the pixel electrode and the opposite electrode by the variable power supply 106, emits light.

The ammeter 107 has first means for measuring the OLED current flowing in all the pixels. While the OLED 105 emits light, the ammeter 107 measures the current thereof. A period required to measure the current varies depending on the performance of the ammeter 107, and a period allotted for measurement has to be longer than the required period. The ammeter 107 reads the average or maximum value of the current flowing during the measurement period.

The measured value obtained by the ammeter 107 is sent as data to the correction circuit 108. The correction circuit 108 also receives a video signal. The structure of the correction circuit 108 is shown in block diagram in FIG. 5.

Reference numeral 120 denotes a current value calculating circuit, 121, a current value comparing circuit, and 122, a power supply controlling circuit. The current value calculating circuit 120 has second means for calculating from the inputted video signal an ideal value (reference value) for the current flowing in the ammeter 107.

The current value comparing circuit 121 has third means for comparing the measured value with the reference value.

The power supply controlling circuit 122 has fourth means for, when the measured value differs from the reference value to a certain degree, controlling the variable power supply 106 to correct the OLED drive voltage and reduce the difference between the measured value and the reference value. Specifically, the power supply controlling circuit corrects the voltage between the power supply lines V1 to Vx and the opposite electrode, thereby correcting the OLED drive voltage in the OLED 105 of each of the pixels 102 and causing a desired amount of OLED drive current to flow.

The OLED drive voltage may be corrected either by controlling the electric potential on the power supply line side or by controlling the electric potential on the opposite electrode side. Alternatively, the correction may be made by controlling both the electric potential on the power supply line side and electric potential on the opposite electrode side.

To make sure the gate voltage of the driving TFT 111 has its share after the voltage correction, it is desirable to adjust the electric potential of the video signal in advance.

Figure 19:
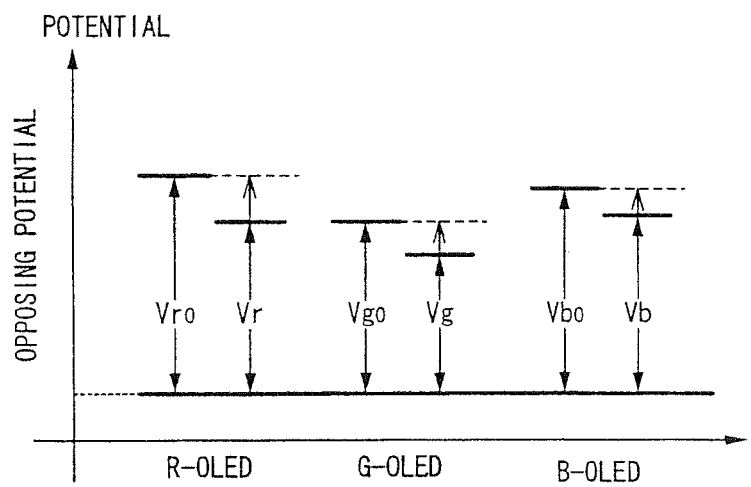
FIG. 19 is a diagram showing changes in voltage by correction.

FIG. 19 shows changes in OLED drive voltage of three types of OLEDs having a plurality of colors when the electric potential on the power supply line side is controlled in a color light emitting device. In FIG. 19, Vr represents the OLED drive voltage of R-OLED before correction whereas $Vr_o$ represents the OLED drive voltage thereof after correction. Similarly, Vg represents the OLED drive voltage of G-OLED before correction whereas $Vg_o$ represents the OLED drive voltage thereof ater correction. Vb represents the OLED drive voltage of B-OLED before correction whereas $Vb_o$ represents the OLED drive voltage thereof after correction.

The electric potential of opposite electrode (opposite electric potential) is fixed to the same level in all of the OLEDs in FIG. 19. The OLED drive voltage is corrected by measuring the OLED drive current and controlling the electric potential of power supply line (power supply electric potential) with the use of the variable power supply for the OLEDs of a plurality of colors separately.

With the above structure, the present invention can control lowering of OLED luminance when the organic light emitting layer is degraded and, as a result, can display a clear image. If the light emitting device is to display in color using OLEDs of a plurality of colors, the luminance of light of a plurality of colors can be kept balanced and images can be displayed in desired colors even when the rate of degradation of organic light emitting layer varies between OLEDs of a plurality of colors.

The present invention can also prevent a change in OLED luminance when the temperature of the organic light emitting layer is influenced by the outside temperature or by heat generated from the OLED panel itself, as well as an increase in power consumption which accompanies temperature rise. If the light emitting device is a color display device, the luminance of light of a plurality of colors can be kept balanced and images can be displayed in desired colors without being influenced by temperature change.

The light emitting device of the present invention is convenient because the OLED current can be measured without disturbing the display on the screen the viewer is viewing.

In a common light emitting device, the electric potential of a wiring line used to supply a current to pixels (power supply line in FIG. 1) may be lowered as the wiring line becomes longer because of the resistance of the wiring line itself. This electric potential is lowered to widely vary degrees depending on an image to be displayed. When the ratio of higher gray scale pixels to all of the pixels that receive a current from the same wiring line is large, in particular, the current flowing through the wiring lines is increased in amount to make lowering of electric potential noticeable. When the electric potential is lowered, a smaller voltage is applied to the OLED of each pixel to reduce the amount of current supplied to each pixel. Therefore, the amount of current supplied to one pixel is changed as well as the gray scale number thereof when the gray scale number of the other pixels that receive a current from the same wiring line as the one pixel is changed, making it impossible for the one pixel to keep a constant gray scale. In the light emitting device of the present invention, on the other hand, the measured value and the reference value are obtained to correct the OLED current each time a new image is displayed. Therefore, a desired gray scale number is obtained for every new image through correction.

According to the present invention, the correction of current may be conducted any time a user desires or may be conducted automatically at a preset time.

Embodiments of the present invention will be described below.

[Embodiment 1]

Figure 5:
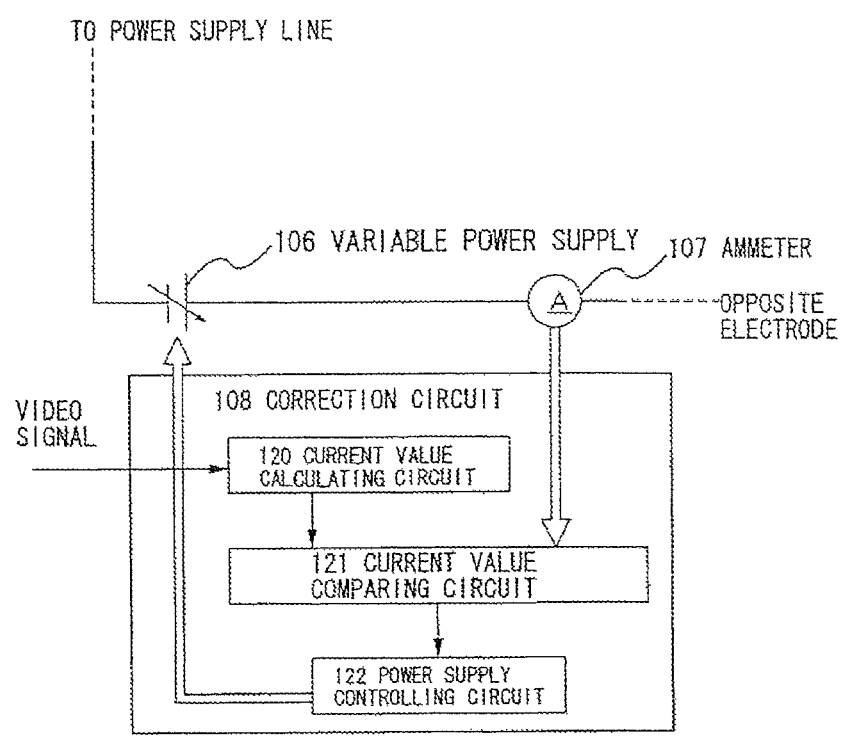
FIG. 5 is a block diagram of a correction circuit.

This embodiment describes details of the correction circuit 108 shown in FIG. 5 in a light emitting device that displays an image using digital video signals.

Figure 6:
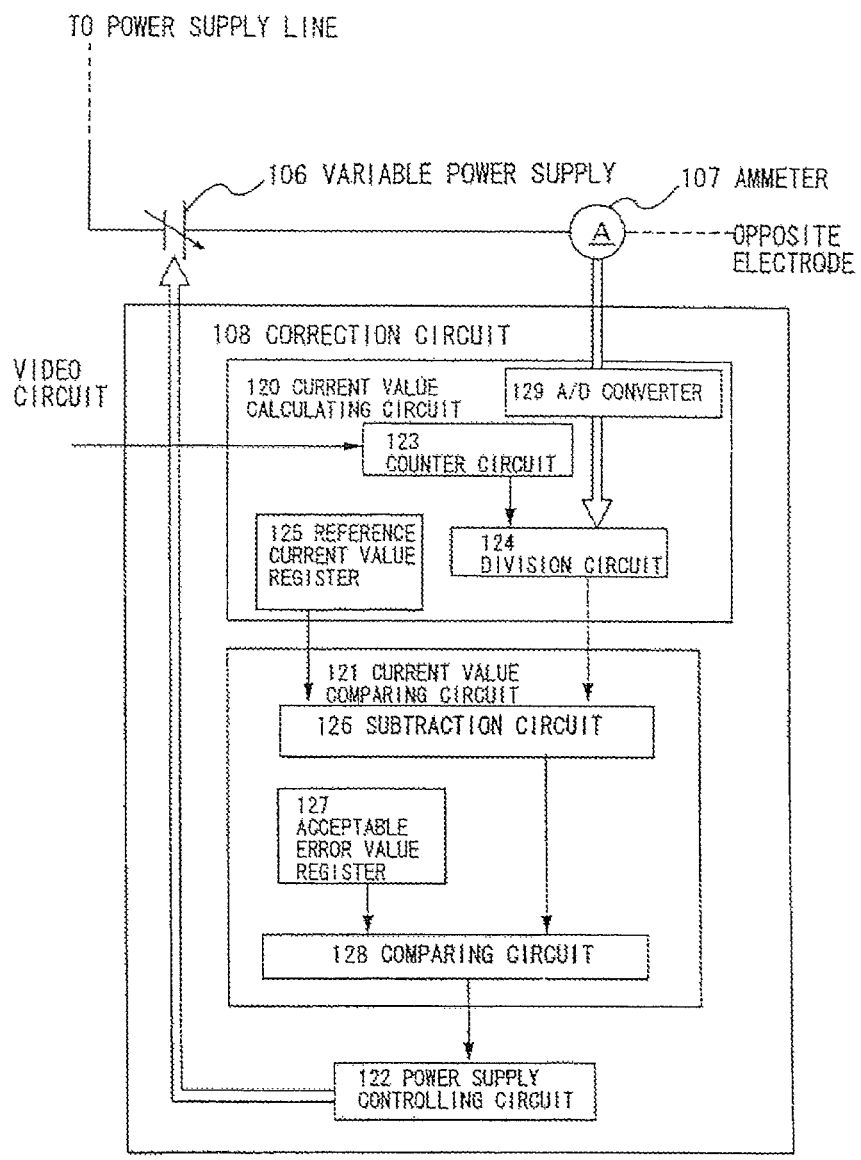
FIG. 6 is a block diagram of a correction circuit.

FIG. 6 shows in block diagram the structure of the correction circuit 108 of this embodiment. The correction circuit 108 has the current value calculating circuit 120, the current value comparing circuit 121, and the power supply controlling circuit 122.

The current value calculating circuit 120 has a counter circuit 123, a divide circuit 124, an A/D converter circuit 129, and a reference current value register 125. Data of a measured value obtained by the ammeter 107 is converted into digital data by the A/D converter circuit 129 and the digital data is then inputted to the divide circuit 124. If a measured value obtained by the ammeter 107 is digital data instead of analog data, the A/D converter circuit 129 is not necessary.

A digital video signal inputted to the current value calculating circuit 120 is inputted to the counter circuit 123. The counter circuit 123 calculates the number of pixels that are emitting light at the time of measuring the current value from a period in which the pulse of the inputted digital video signal is generated. The calculated number of pixels is sent as data to the divide circuit 124.

In the divide circuit 124, a value of current flowing in the OLED of each emitting pixel (pixel measured value) is calculated from the inputted measured value and from the number of emitting pixels. The obtained pixel measured value is inputted as data to the current value comparing circuit 121.

The current value comparing circuit 121 has a subtraction circuit 126, an acceptable error value register 127, and a comparing circuit 128.

The pixel measured value inputted to the current value comparing circuit 121 is inputted to the subtraction circuit 126. The reference current value register 125 has an ideal OLED current value of each pixel (reference value) stored therein. The reference value may be a fixed data determined by design of mask or the like, or may be rewritable by a CPU, a dip switch, or the like.

The reference value stored in the reference current value register 125 is inputted to the subtraction circuit 126. The subtraction circuit 126 calculates the difference between the pixel measured value inputted from the divide circuit 124 and the reference value (the difference is hereinafter referred to as deviation current).

Figure 7:
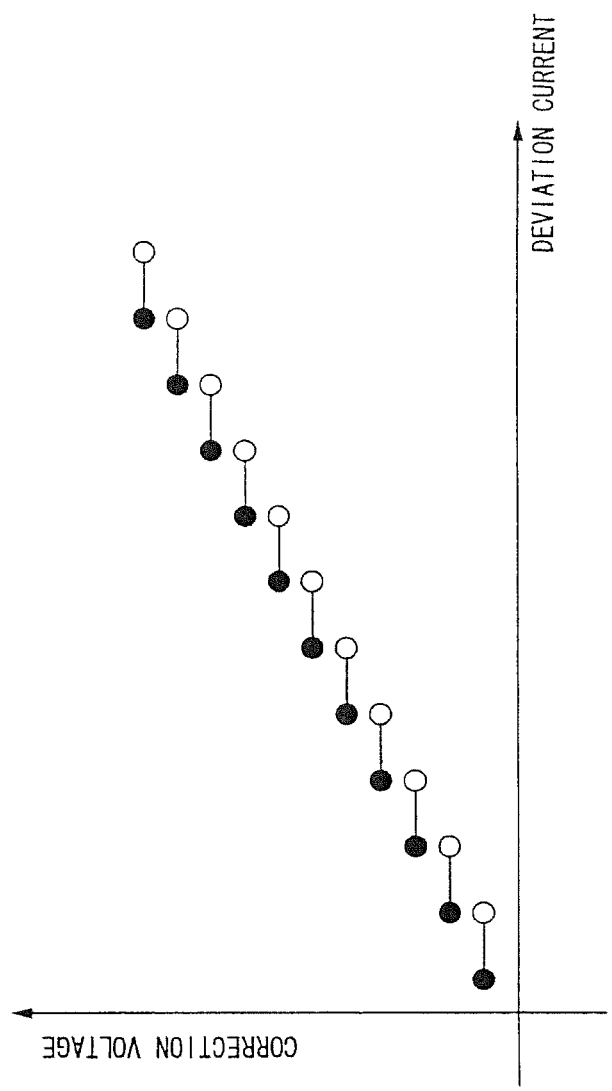
FIG. 7 is a diagram showing the relation between deviation current and correction voltage.

The deviation current is inputted as data to the comparing circuit 128. The voltage between the power supply lines V1 to Vx and the opposite electrode which is changed by correction is called a correction voltage. The acceptable error value register 127 stores a value for determining a deviation current range in which correction of voltage is not necessary. The voltage is corrected as many times as it takes for the deviation current to reach this range. If the deviation current is fixed to 0 as a result of voltage correction, the acceptable error value register 127 is not necessary. However, in practice, the deviation current continues to experience minute changes due to fluctuation in measurement by the ammeter 107, errors in calculation by the subtraction circuit 126, noises, and the like. In order to avoid redundant voltage correction repeated endlessly as the deviation current continues to change minutely, it is very effective to use the acceptable error register 127 to determine a deviation current range in which the voltage is not corrected. The acceptable error value register 127 may store a correction voltage value associated with a deviation current value, in addition to the deviation current range in which the voltage is not corrected. The relation between deviation current and correction voltage is, for example, as shown in FIG. 7. In FIG. 7, the correction voltage goes under a certain degree of change every time the deviation current experiences a given amount of change.

The relation between deviation current and correction voltage may not always follow the graph shown in FIG. 7. It is sufficient for deviation current and correction voltage to have a relation that makes the value of a current actually flowing in the ammeter approach the reference value. For example, deviation current and correction voltage may have a linear relation or deviation current may be in proportion to the square of correction voltage.

The relation between deviation current and correction voltage, which is stored in the acceptable error value register 127, may be a fixed data determined by design of mask or the like, or may be rewritable by a CPU, a dip switch, or the like.

The comparing circuit 128 inputs correction voltage of a given value as data to the power supply controlling circuit 122 when the deviation current data inputted from the subtraction circuit 126 is outside the deviation current range in which the voltage is not corrected and which is stored in the acceptable error value register 127. The value of this correction voltage is set in advance by the comparing circuit 128. The preset correction voltage value is inputted to the power supply controlling circuit 122 whenever the deviation current is outside the no-voltage-correction range.

The power supply controlling circuit 122 controls the variable power supply 106 based on the inputted correction voltage value, to thereby correct the voltage between the power supply lines V1 to Vx and the opposite electrode by the correction voltage value. With the above structure, the OLED drive voltage is corrected in the OLED 105 of each of the pixels 102 and the OLED drive current approaches a desired amount.

The OLED drive voltage may be corrected either by controlling the electric potential on the power supply line side or by controlling the electric potential on the opposite electrode side. Alternatively, the correction may be made by controlling both the electric potential on the power supply line side and electric potential on the opposite electrode side.

The correction circuit 108 corrects the voltage as many times as it takes for the deviation current to reach the no-voltage-correction range stored in the acceptable error value register 127.

When the correction voltage value associated with the deviation current value is stored in the acceptable error value register 127 as shown in FIG. 7, the comparing circuit 128 determines the correction voltage value by comparing the deviation current data inputted from the subtraction circuit 126 with the relation between deviation current and correction voltage which is stored in the acceptable error value register 127. In this case, the deviation current can be reduced by a small number of voltage corrections even if the deviation current has a large value.

The counter circuit 123 may be substituted by a full adder combined with a memory.

The subtraction circuit 126 used in this embodiment may be replaced by any circuit that can recognize how far a measured value is from the reference value. For example, a divide circuit may be used in place of the subtraction circuit 126. When a divide circuit is employed, the divide circuit calculates the ratio of a measured value to the reference value. From the ratio of a measured value to the reference value, the comparing circuit 128 determines the correction voltage value.

With the above structure, the light emitting device of the present invention can keep the OLED current constant when the organic light emitting layer is degraded to prevent lowering of luminance and, as a result, can display a clear image. The light emitting device of the present invention can keep the OLED drive current constant also when there is a temperature change in the organic light emitting layer by correcting the OLED drive voltage. Therefore, the luminance can be kept constantly irrespective of temperature change and an increase in power consumption, accompanying temperature rise can be prevented. Furthermore, the light emitting device of the present invention obtains the measured value and the reference value to correct the OLED current each time a new image is displayed. Therefore, a desired gray scale number is obtained for every new image through correction.

The structure of the correction circuit shown in this embodiment is merely an example and the present invention is not limited thereto. The only requirement of a correction circuit used in the present invention is to have the following means: means for calculating from a video signal an ideal value (reference value) for the OLED drive current flowing all or each of pixels, means for comparing a measured value with the reference value, and means for correcting the OLED drive voltage so as to reduce the difference between the measured value and the reference value if there is a certain difference therebetween.

[Embodiment 2]

This embodiment describes a structure different from the one in Embodiment 1 for the correction circuit 108 shown in FIG. 5.

Figure 8:
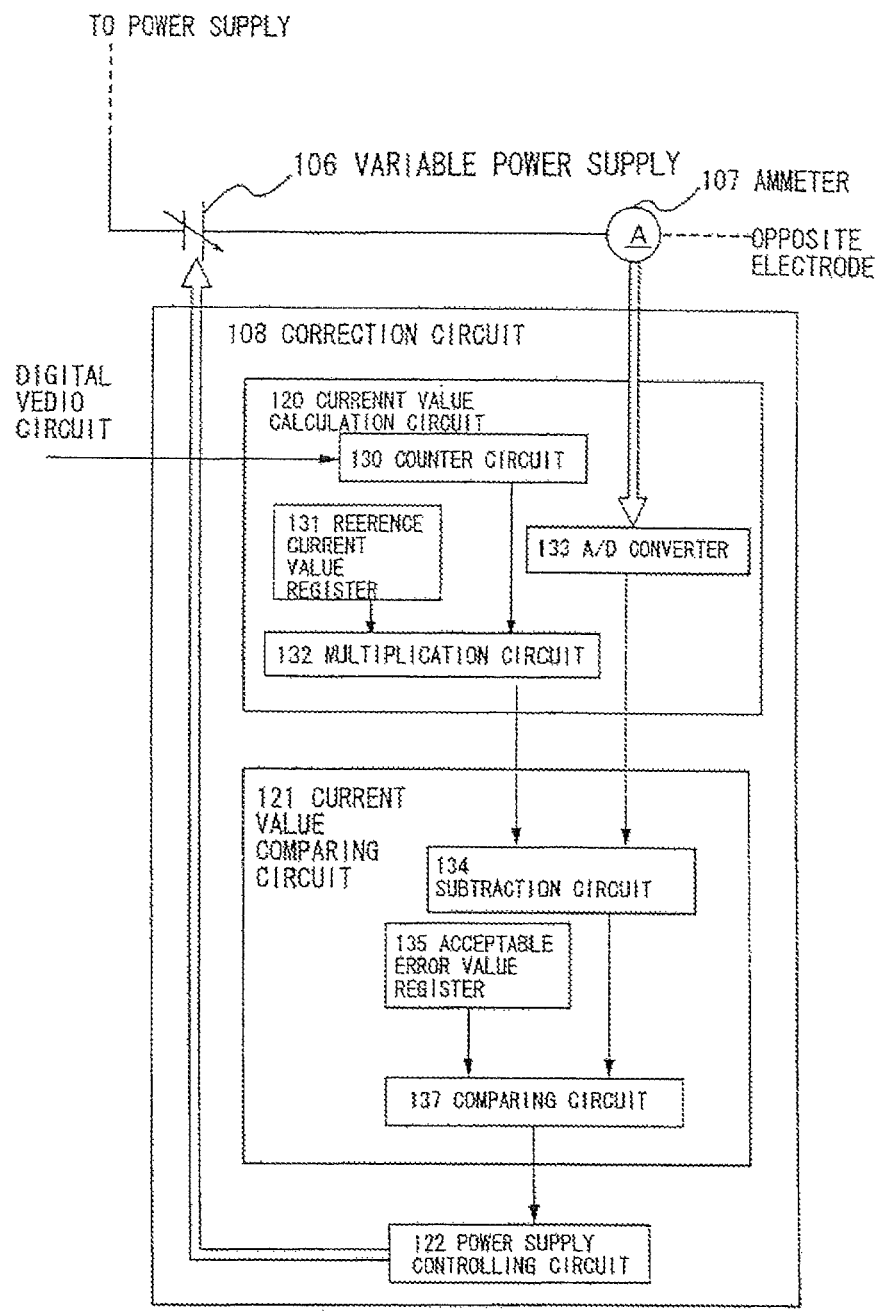
FIG. 8 is a block diagram of a correction circuit.

FIG. 8 shows in block diagram the structure of the correction circuit 108 of this embodiment. Similar to Embodiment 1, the correction circuit 108 of this embodiment has the current value calculating circuit 120, the current value comparing circuit 121, and the power supply controlling circuit 122.

The current value calculating circuit 120 has a counter circuit 130, a reference current value register 131, a multiplication circuit 132, and an A/D converter circuit 133. Data of a measured value obtained by the ammeter 107 is converted into digital data by the A/D converter circuit 133 and the digital data is then inputted to the current value comparing circuit 121. If a measured value obtained by the ammeter 107 is digital data instead of analog data, the A/D converter circuit 133 is not necessary.

A digital video signal inputted to the current value calculating circuit 120 is inputted to the counter circuit 130. The counter circuit 130 calculates the number of pixels that are emitting light at the time of measuring the current value from a period in which the pulse of the inputted digital video signal is generated. The calculated number of pixels is sent as data to the multiplication circuit 132.

The reference current value register 131 has an ideal OLED current value of each pixel (reference value) stored therein. The reference value may be a fixed data determined by design of mask or the like, or may be rewritable by a CPU, a dip switch, or the like.

The reference value stored in the reference current value register 131 is inputted as data to the multiplication circuit 132. The multiplication circuit 132 calculates a total reference value for the OLED drive current flowing in all of the pixels from the inputted reference value and from the number of emitting pixels.

The total reference value calculated by the multiplication circuit 132 is inputted as data to the current value comparing circuit 121.

The data of measured value and total reference value which are inputted to the current value comparing circuit 121 are then inputted to a subtraction circuit 134. The subtraction circuit 134 calculates the difference between the inputted data of measured value and total reference value (the difference is hereinafter referred to as deviation current). The deviation current calculated is inputted as data to a comparing circuit 137.

The voltage between the power supply lines V1 to Vx and the opposite electrode which is changed by correction is called a correction voltage. An acceptable error value register 135 stores a deviation current range in which correction of voltage is not necessary in the form of a ratio to the total reference value. The voltage is corrected as many times as it takes for the deviation current to reach this range. If the deviation current is fixed to 0 as a result of voltage correction, the acceptable error value register 135 is not necessary. However, in practice, the deviation current continues to experience minute changes due to fluctuation in measurement by the ammeter 107, errors in calculation by the subtraction circuit 134, noises, and the like. In order to avoid redundant voltage correction repeated endlessly as the deviation current continues to change minutely, it is very effective to use the acceptable error value register 135 to determine a deviation current range in which voltage is not corrected. The acceptable error value register 135 may store a correction voltage value associated with a deviation current value, in addition to the deviation current range in which voltage is not corrected. It is sufficient for deviation current and correction voltage to have a relation that makes the value of a current actually flowing in the ammeter approach the reference value. For example, deviation current and correction voltage may have a linear relation or deviation current may be in proportion to the to square of correction voltage.

The relation between deviation current and correction voltage, which is stored in the acceptable error value register 135, may be a fixed data determined by design of mask or the like, or may be rewritable by a CPU, a dip switch, or the like.

The comparing circuit 137 calculates the deviation current range in which the voltage is not corrected from the ratio to the total reference vale which is stored in the acceptable error value register 135. Then, the comparing circuit inputs correction voltage of a given value as data to the power supply controlling circuit 122 when the deviation current data inputted from the subtraction circuit 134 is outside the obtained deviation current range. The value of this correction voltage is set in advance by the comparing circuit 137. The preset correction voltage value is inputted to the power supply controlling circuit 122 whenever the deviation current is outside the no-voltage-correction range.

The power supply controlling circuit 122 controls the variable power supply 106 based on the inputted correction voltage value, to thereby correct the voltage between the power supply lines V1 to Vx and the opposite electrode by the correction voltage value. With the above structure, the OLED drive voltage is corrected in the OLED 105 of each of the pixels 102 and the OLED drive current approaches a desired amount.

The OLED drive voltage may be corrected either by controlling the electric potential on the power supply line side or by controlling the electric potential on the opposite electrode side. Alternatively, the correction may be made by controlling both the electric potential on the power supply line side and electric potential on the opposite electrode side.

The correction circuit 108 corrects the voltage as many times as it takes for the deviation current to reach the no-voltage-correction range stored in the acceptable error value register 135.

When the correction voltage value associated with the deviation current value is stored in the acceptable error value register 135, the comparing circuit 137 determines the correction voltage value by comparing the deviation current data inputted from the subtraction circuit 134 with the relation between deviation current and correction voltage which is stored in the acceptable error value register 135. In this case, the deviation current can be reduced by a small number of voltage corrections even if the deviation current has a large value.

The counter circuit 130 may be substituted by a full adder combined with a memory.

The subtraction circuit 134 used in this embodiment may be replaced by any circuit that can recognize how far a measured value is from the total reference value. For example, a divide circuit may be used in place of the subtraction circuit 134. When a divide circuit is employed, the divide circuit calculates the ratio of a measured value to the total reference value. From the ratio of a measured value to the total reference value, the comparing circuit 137 determines the correction voltage value.

With the above structure, the light emitting device of the present invention can keep the OLED current constant when the organic light emitting layer is degraded to prevent lowering of luminance and, as a result, can display a clear image. The light emitting device of the present invention can keep the OLED drive current constant also when there is a temperature change in the organic light emitting layer by correcting the OLED drive voltage. Therefore, the luminance can be kept constantly irrespective of temperature change and an increase in power consumption accompanying temperature rise can be prevented. Furthermore, the light emitting device of the present invention obtains the measured value and the reference value to correct the OLED current each time a new image is displayed. Therefore, a desired gray scale number is obtained for every new image through correction.

The structure of the correction circuit shown in this embodiment is merely an example and the present invention is not limited thereto. The only requirement of a correction circuit used in the present invention is to have the following means: means for calculating from a video signal an ideal value (reference value) for the OLED drive current flowing all or each of pixels, means for comparing a measured value with a reference value, and means for correcting the OLED drive voltage so as to reduce the difference between the measured value and the reference value if there is a certain difference therebetween.

[Embodiment 3]

This embodiment describes a method of driving a light emitting device that has the pixel shown in FIG. 4 by using a digital video signal. Also described here is timing of correcting voltage.

Figure 9:
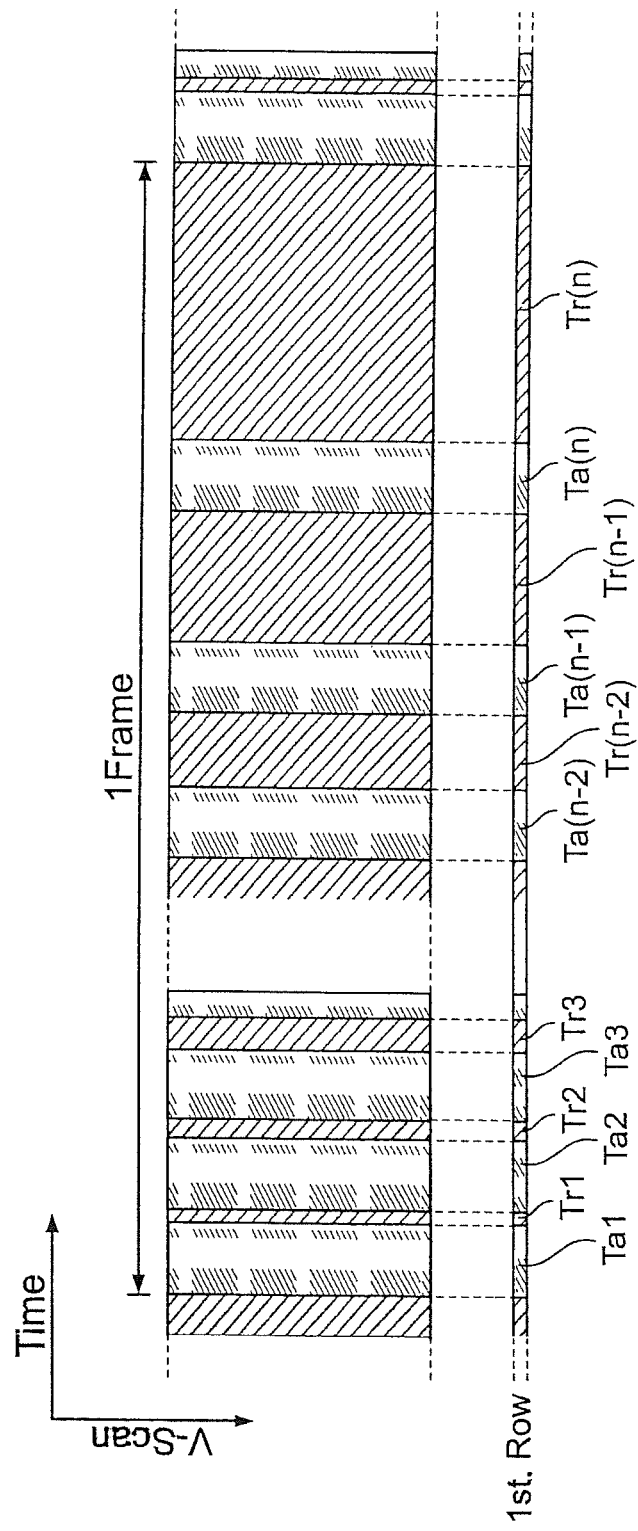
FIG. 9 is a diagram showing a method of driving a light emitting device according to the present invention.

The driving method of this embodiment will be described with reference to FIG. 9. In FIG. 9, the axis of abscissa indicates time and the axis of ordinate indicates positions of pixels connected to each of the gate lines.

First, a writing period Ta is started and the electric potential of the opposite electrode of the OLED 105 and the electric potential of the power supply lines V1 to Vx are kept at the same level. A selection signal is outputted from the gate line driving circuit 104 to turn the switching TFT 110 of every pixel that is connected to the gate line G1 (every pixel on Line One) ON.

A first set of one bit digital video signals are inputted to the source lines (S1 to Sx). The signals are then inputted to the gate electrode of the driving TFT 111 through the switching TFT 110 by the source line driving circuit 103.

Next, the switching TFT 110 is turned OFF in each of the pixels on Line One whereas the switching TFT 110 in every pixel on Line Two which is connected to the gate line G2 is turned ON by a selection signal similar to the pixels on Line One. Then, the first set of one bit digital video signals are inputted from the source lines (S1 to Sx) to the gate electrode of the driving TFT 111 through the switching TFT 110 of each of the pixels on Line Two.

In this way, the first set of one bit digital video signals are inputted to the pixels of all the lines one line at a time. A period it takes for the first set of one bit digital video signals to be inputted to the pixels of all the lines is a writing period Ta1. In this embodiment, inputting a digital video signal to a pixel means inputting the digital video signal to the gate electrode of the driving TFT 111 through the switching TFT 110.

As the writing period Ta1 is ended, a display period Tr1 is started next. In the display period Tr1, the electric potential of the opposite electrode is set to a level that produces an electric potential difference with the power supply electric potential of the power supply lines large enough to cause the OLED to emit light.

In this embodiment, the driving TFT 111 is turned OFF when the digital video signal contains information of '0'. Accordingly, the power supply electric potential is not given to the pixel electrode of the OLED 105. Therefore, no light is emitted from the OLED 105 of a pixel to which a digital video signal having information of '0' is inputted.

When the digital video signal has information of '1', on the other hand, the driving TFT 111 is turned ON. Then, the power supply electric potential is given to the pixel electrode of the OLED 105. Therefore, light is emitted from the OLED 105 of a pixel to which a digital video signal having information of '1' is inputted.

Thus, the OLED 105 emits or does not emit light in the display period Tr1 to display an image. A period in which pixels are used to display an image is called a display period Tr. The display period Tr1 is a name for a specific display period that is started upon input of a first set of one bit digital video signals to pixels.

As the display period Tr1 is ended, a writing period Ta2 is started and the electric potential of the opposite electrode of the OLED and the power supply electric potential of the power supply lines are again set to the same level. Similar to the writing period Ta1, all the gate lines are selected one at a time and a second set of one bit digital video signals are inputted to all of the pixels in order. The writing period Ta2 is a period it takes for the second set of one bit digital video signals to be inputted to pixels of all the lines.

As the writing period Ta2 is ended, a display period Tr2 is started and the electric potential of the opposite electrode is set to a level that produces an electric potential difference with the power supply electric potential of the power supply lines large enough to cause the OLED to emit light. Then, a part of one image is displayed by the pixels.

The above operation is repeated until inputting an n-th set of one bit digital video signals to the pixels is finished, alternating one writing period Ta with one display period Tr. When all display periods (Tr1 to Trn) are completed, one image is displayed. In this specification, a period required to display one image is called one frame period (F). When one frame period is ended, the next frame period is started. Then, the writing period Ta1 is started again to repeat the operation described above.

In a usual light emitting device, preferably sixty or more frame periods are to provided in one second. If the number of images displayed in one second is less than sixty, flickering of image may become noticeable to the eye.

In this embodiment, the lengths of all writing periods in total have to be shorter than the length of one frame period and it is necessary to set the ratio of lengths of display periods to satisfy Tr1:Tr2:Tr3: . . . :Tr(n−1):Trn= $2^0:2^1:2^2: \ldots :2^{(n-2)}:2^{(n-1)}$. A desired gray scale out of $2^n$ gray scales can be obtained by combining the display periods.

The gray scale of a pixel in one frame period is determined by the sum of lengths of display periods in the one frame period in which the OLED of that pixel emits light. For example, if n=8, a pixel obtains 100% of luminance when the pixel emits light in all display periods. When the pixel emits light in Tr1 and Tr2, the luminance thereof is 1%. When the pixel emits light in Tr3, Tr5, and Tr8, the luminance thereof is 60%.

The display periods Tr1 to Trn may be run in any order. For instance, in one frame period started by Tr1, Tr3, Tr5, Tr2, . . . may follow Tr1 in this order.

Described next are a timing of measuring current and a timing of calculating a reference value from a digital video signal in order to correct the OLED drive voltage.

In this embodiment, digital video signals are inputted to a current value calculating circuit at the same time digital video signals are inputted to pixels in the writing periods Ta1 to Tan. As described in Embodiment 1 or 2, a counter circuit or the like calculates the number of emitting pixels from the digital video signals.

Then, using the obtained number of emitting pixels, a pixel measured value is calculated in Embodiment 1 whereas a reference value is calculated in Embodiment 2.

In this embodiment, the current is measured in the display periods Tr1 to Trn. However, when to start each display period varies between pixels on one line and pixels on another line. Therefore, it is important to measure the OLED current in every pixel at once after a display period is started in all pixels and before that display period is ended in all pixels to obtain the total OLED current.

The driving method of this embodiment is merely an example, and the light emitting devices shown in FIGS. 1 and 4 in accordance with the present invention can be driven by other methods than the driving method of this embodiment.

The structure of the correction circuit shown in this embodiment is merely an example and the present invention is not limited thereto. The only requirement of a correction circuit used in the present invention is to have the following means: means for calculating from a video signal an ideal value (reference value) for the OLED drive current flowing all or each of pixels, means for comparing a measured value with a reference value, and means for correcting the OLED drive voltage so as to reduce the difference between the measured value and the reference value if there is a certain difference therebetween.

This embodiment may be combined freely with Embodiment 1 or 2.

[Embodiment 4]

This embodiment describes a different structure for the pixel in a light emitting device of the present invention than the one shown in FIG. 4.

Figure 10:
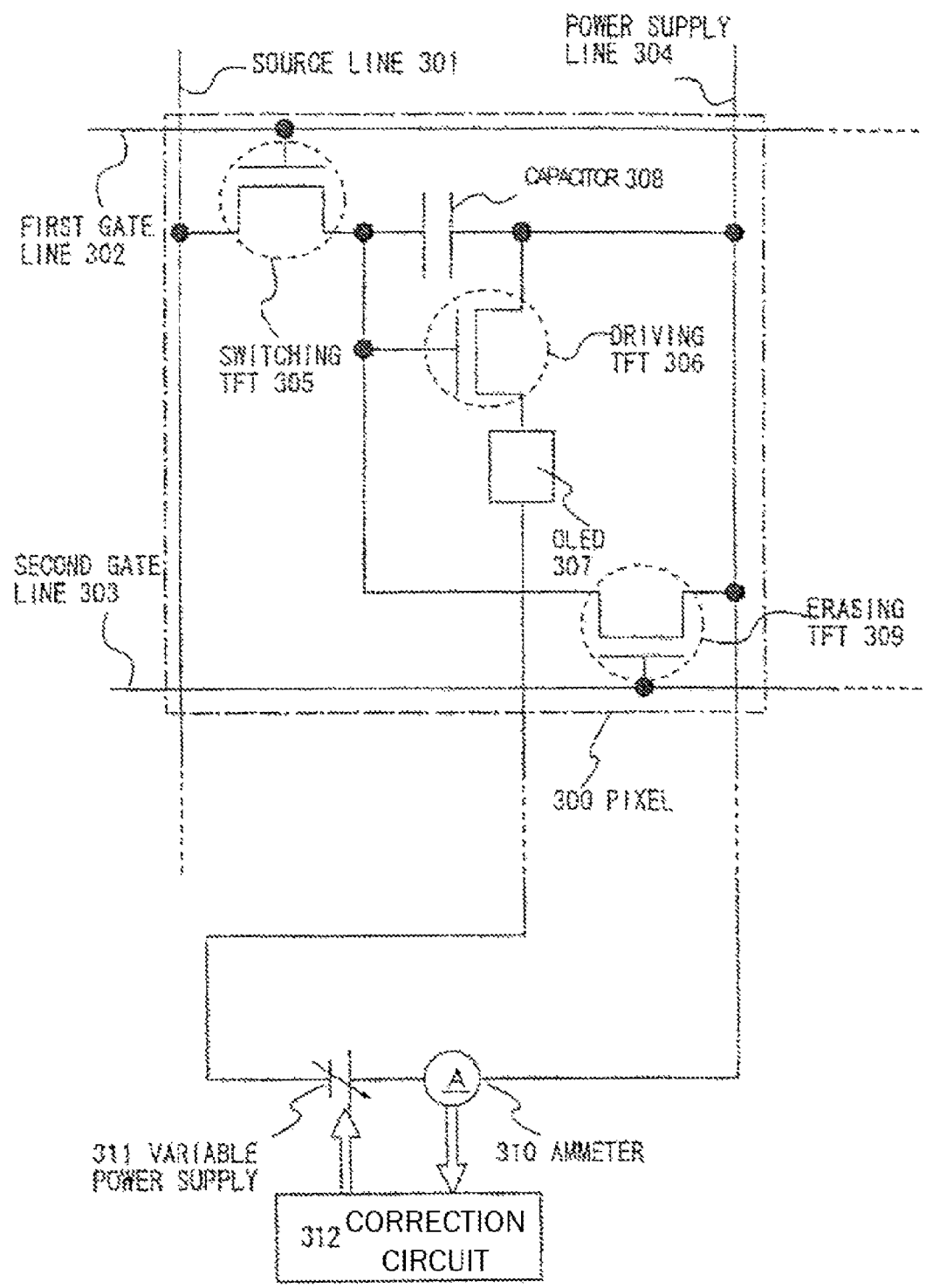
FIG. 10 is a pixel circuit diagram of a light emitting device of the present invention.

FIG. 10 shows the structure of the pixel of this embodiment. The light emitting device of this embodiment has a pixel portion where pixels 300 form a matrix. Each of the pixels 300 has a source line 301, a first gate line 302, a second gate line 303, a power supply line 304, a switching TFT 305, a driving TFT 306, an erasing TFT 309, to and an OLED 307.

A gate electrode of the switching TFT 305 is connected to the first gate line 302. The switching TFT 305 has a source region and a drain region one of which is connected to the source line 301 and the other of which is connected to a gate electrode of the driving TFT 306.

A gate electrode of the erasing TFT 309 is connected to the second gate line 303. The erasing TFT 309 has a source region and a drain region one of which is connected to the power supply line 304 and the other of which is connected to the gate electrode of the driving TFT 306.

A source region of the driving TFT 306 is connected to the power supply line 304 whereas a drain region of the TFT is connected to a pixel electrode of the OLED 307. A capacitor 308 is formed between the gate electrode of the driving TFT 306 and the power supply line 304.

The power supply line 304 is connected to a variable power supply 311 through an ammeter 310. An opposite electrode of every OLED 307 is connected to the variable power supply 311. In FIG. 10, the variable power supply 311 is connected such that the power supply line side is kept at the high electric potential (Vdd) whereas the opposite electrode side is kept at the low electric potential (Vss). However, the present invention is not limited thereto. It is sufficient if the variable power supply 311 is connected in a manner that sets the current flowing into the OLED 307 to forward bias.

If the device is to display in color, correction of the OLED drive voltage may be made for OLEDs of a plurality of colors separately by providing one variable power supply and one ammeter for each color. In this case, the device may have one correction circuit for each color or OLEDs of a plurality of colors may share a single correction circuit.

The position of the ammeter 310 does not need to be between the variable power supply 311 and the power supply line 304. The ammeter may be placed between the variable power supply 311 and the opposite electrode.

Denoted by 312 is a correction circuit, which controls the voltage to be supplied to the opposite electrode and to the power supply line 304 from the variable power supply 311 based on a current value measured by the ammeter 310 (measured value).

The ammeter 310, the variable power supply 311, and the correction circuit 312 may be formed on a substrate different from the one on which the pixel portion is formed to be connected to the pixel portion through a connector or the like. If possible, they may be formed on the same substrate on which the pixel portion is formed.

Figure 11:
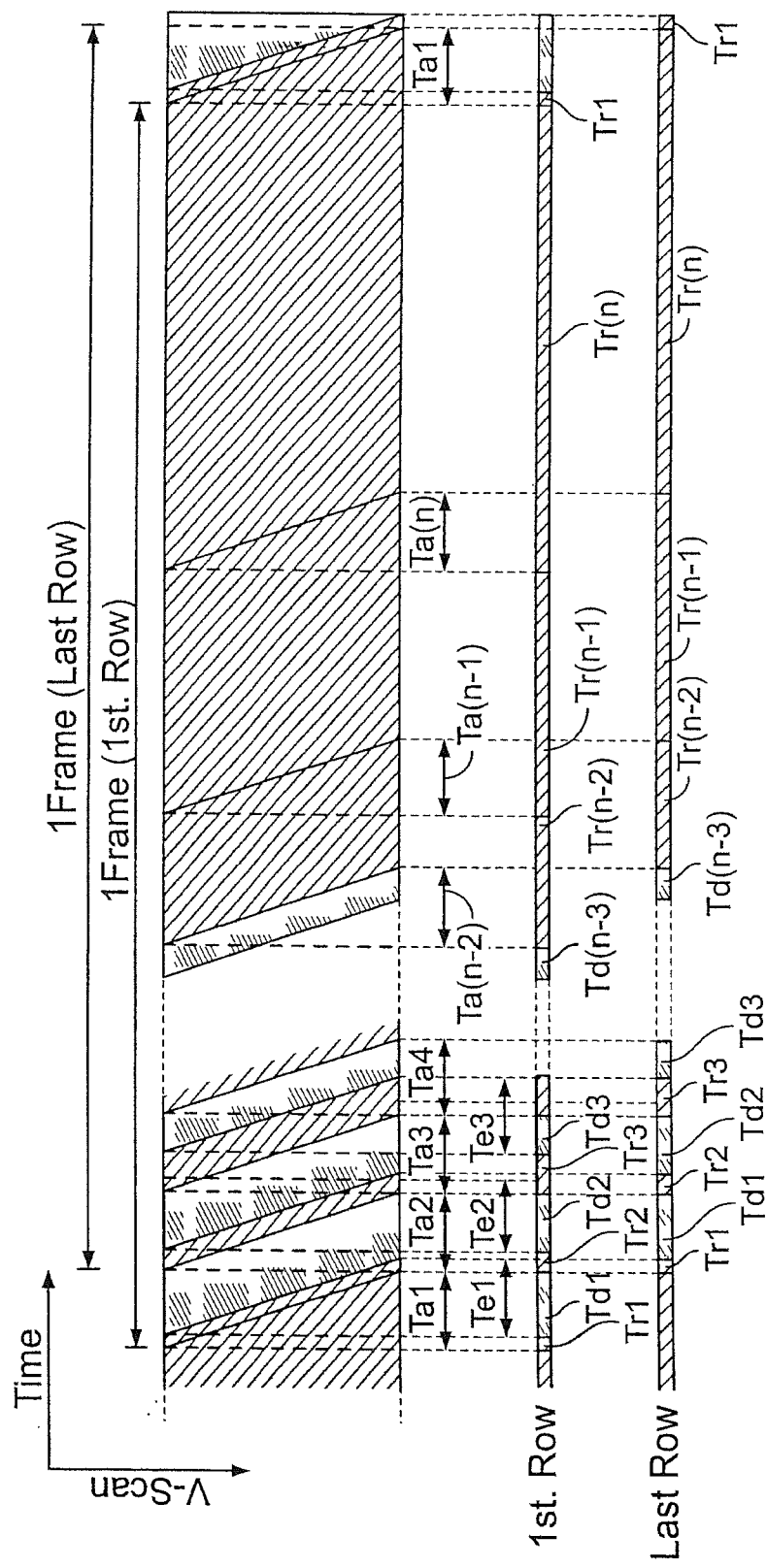
FIG. 11 is a diagram showing a method of driving a light emitting device according to the present invention.

Next, a description is given on a method of driving the light emitting device in accordance with this embodiment. The driving method in this embodiment will be described with reference to FIG. 11. In FIG. 11, the axis of abscissa indicates time and the axis of ordinate indicates positions of pixels connected to each of the gate lines.

First, a writing period Ta1 is started and the first gate line on Line One is selected to turn the switching TFT 305 of every pixel that is connected to the first gate line on Line One (every pixel on Line One) ON.

A first set of one bit digital video signals are inputted to the source line 301. Then the signals are inputted to the gate electrode of the driving TFT 306 through the switching TFT 305. Switching of the driving TFT 306 is controlled by information of the digital video signals, '0' or '1'. When the driving TFT 306 is turned OFF, the OLED 307 does not emit light. When the driving TFT 306 is turned ON, on the other hand, the OLED 307 emits light.

Upon input of digital video signals to pixels on Line One, the OLED 307 emits or does not emit light and the pixels on Line One moves to a display period Tr1. Points at which a display period is started in pixels on one line differs from points at which the display period is started in pixels on another line.

After the first gate line 302 on Line One stops being selected, the first gate line 302 on Line Two is selected next. Then, the first gate lines on the subsequent lines are selected one at a time until the first gate line 302 on the last line is selected. As in the pixels on Line One, the first set of one bit digital video signals are inputted to the pixels of all the lines. The display period Tr1 is started in pixels on each line. Points at which a display period is started in pixels on one line differs from points at which the display period is started in pixels on another line. The writing period Ta1 is a period required to input the first set of one bit digital video signals to the pixels of all the lines.

While the first set of one bit digital video signals are inputted to the pixels, the second gate line 303 on Line One is selected to turn the erasing TFT 309 of every pixel that is connected to the second gate line 303 on Line One (every pixel on Line One) ON. Then the power supply electric potential of the power supply line 304 is given to the gate electrode of the driving TFT 306 through the switching TFT 309.

When the power supply electric potential is given to the gate electrode of the driving TFT 306, the gate electrode and the source region of the driving TFT 306 receive the same electric potential. This sets the gate voltage to 0 V and turns the driving TFT 306 OFF. Accordingly, the power supply electric potential is not given to the pixel electrode of the OLED 307 and no light is emitted from the OLED 307 of every pixel that is on Line One.

A period in which pixels are not used to display is called a non-display period Td. At the instant the second gate line 303 is selected, the display period Tr1 is ended to start a non-display period Td1 in the pixels on Line One.

After the second gate line 303 on Line One stops being selected, the second gate line 303 on Line Two is selected next. Then, the second gate lines on the subsequent lines are selected one at a time until the second gate line 303 on the last line is selected. The non-display period Td1 is started in every pixel. Similar to display periods, points at which a non-display period is started in pixels on one line differs from points at which the non-display period is started in pixels on another line. A period required to select all the second gate lines and start Td1 in every pixel is an erasing period Te1.

Before or after the erasing period Te1 is ended, a writing period is again started. This writing period is a writing period Ta2 in which a second set of one bit digital video signals are inputted to all the pixels. When inputting the second set of one bit digital video signals to pixels of every line is finished, a display period Tr2 is started.

The above operation is repeated until inputting an n-th set of one bit digital video signals to the pixels is finished, alternating one writing period Ta with one display period Tr. If a display period is longer than a writing period, one display period and another display period may be started in succession.

A display period is defined as a period starting as a writing period is started and ending as the next writing period or a non-display period is started. A non-display period is defined as a period starting as an erasing period is started and ending as the next writing period is started.

When all display periods are completed, one image is displayed. In the present invention, a period required to display one image is called one frame period (F).

When one frame period is ended, the next frame period is started. Then a writing period is started again to repeat the operation described above.

It is important in this embodiment to make sure the lengths of all writing periods in total are shorter than the length of one frame period. In addition, the ratio of lengths of display periods has to satisfy $Tr1:Tr2:Tr3:\ldots:Tr(n-1):Trn=2^0:2^1:2^2:\ldots:2^{(n-2)}:2^{(n-1)}$. A desired gray scale out of $2^n$ gray scales can be obtained by combining the display periods.

The gray scale of a pixel in one frame period is determined by the sum of lengths of display periods in the one frame period in which the OLED of that pixel emits light. For example, if n=8, a pixel obtains 100% of luminance when the pixel emits light in all display periods. When the pixel emits light in Tr1 and Tr2, the luminance thereof is 1%. When the pixel emits light in Tr3, Tr5, and Tr8, the luminance thereof is 60%.

The display periods Tr1 to Trn may be run in any order. For instance, in one frame period started by Tr1, Tr3, Tr5, Tr2, . . . may follow Tr1 in this order.

Described next are the structure of the correction circuit in the light emitting device of this embodiment, a timing of measuring current, and a timing of calculating a reference value from a digital video signal for correcting the OLED drive voltage.

The correction circuit of this embodiment has a structure that is different from the structure of the correction circuit of Embodiment 1 or 2 only in the mechanism of the circuit for calculating the number of emitting pixels from a digital video signal. To be specific, while the counter circuit alone counts the number of emitting pixels in Embodiment 1 or 2, this embodiment uses a memory reset circuit, a pulse counter memory, and an adder circuit in addition to the counter circuit to count the number of emitting pixels. In this embodiment, the circuits for counting the number of emitting pixels, including the counter circuit, the memory reset circuit, the pulse counter memory, and the adder circuit, are together called a pixel number counter circuit for conveniences' sake.

Figure 12:
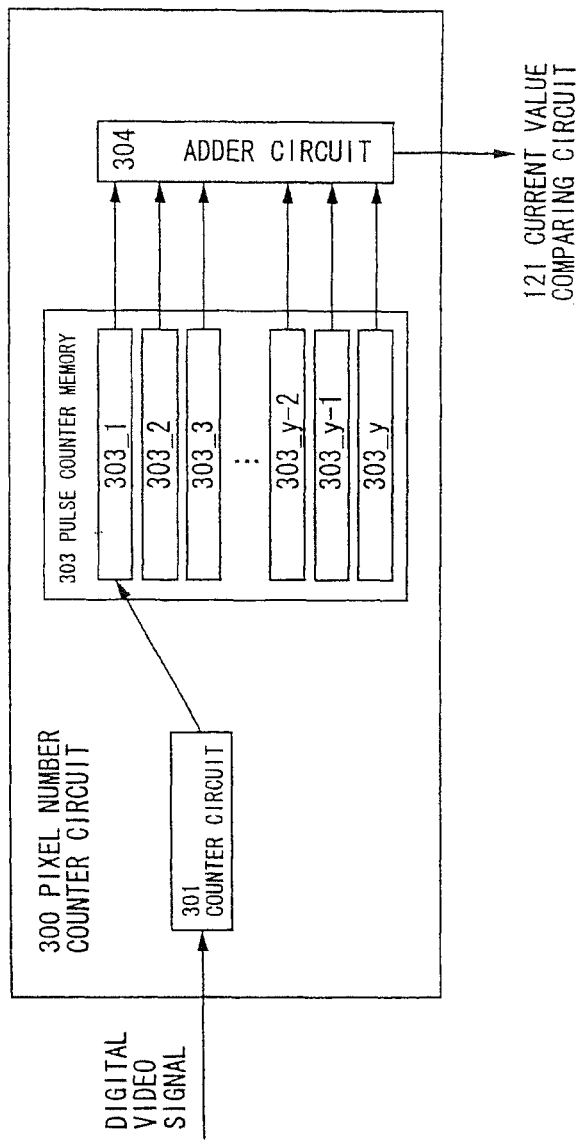
FIG. 12 is a block diagram of a pixel number counter circuit.

FIG. 12 shows in block diagram the structure of a pixel number counter circuit 300 of this embodiment. The pixel number counter circuit 300 has a counter circuit 301, a pulse counter memory 303, and an adder circuit 304. The correction circuit of this embodiment is obtained by using the pixel number counter circuit 300 in place of the counter circuit 123 or 130 of the current value calculating circuit 120 in the correction circuit 108 shown in FIG. 6 or 8.

The pulse counter memory 303 is divided into sections and each section stores data for pixels connected to the same gate line on each line. A storing section in a memory is called herein a block. If there are y gate lines, the number of blocks provided has to be y or more. The blocks are numbered to match the line numbers of their associated lines and denoted by 303_1 to 303_y.

In this embodiment, digital video signals are inputted to the pixel number counter circuit 300 while digital video signals are inputted to pixels in writing periods Ta1 to Tan. Digital video signals are inputted to the pixel number counter circuit 300 one line at a time in each writing period.

For example, at the same time pixels on Line One receive digital video signals, digital video signals that have the same image information as the digital video signals inputted to the pixels on Line One are inputted to the counter circuit 301 of the pixel number counter circuit 300. The difference is that a parallel processing method is used to input signals to the pixels on Line One and a serial processing method is used to input signals to the counter circuit 301.

The counter circuit 301 calculates the number of emitting pixels on Line One from the inputted digital video signals. The obtained pixel number is stored in the first block 303_1 in the pulse counter memory 303.

Subsequently, digital video signals for pixels on Line Two to Line y are inputted to the counter circuit 301 in order. The number of emitting pixels is similarly is calculated for each line and the obtained pixel number is stored in an associated block among the blocks 303_2 to 303_y.

As soon as the pixel number is stored in a block, it is inputted to the adder circuit 304. The adder circuit 304 sums up the pixel numbers inputted from the blocks. The obtained total number of emitting pixels is sent as data to a downstream circuit. Specifically, the data is inputted to the divide circuit 124 in the case of FIG. 6 and to the multiplication circuit 132 in the case of FIG. 8.

If a writing period is shorter than a display period, an erasing period is started before the writing period is ended. In this case, the number of emitting pixels is always 0 and the memory reset circuit 302 stores data that says the pixel number is 0 first in a block for pixels on a line where the erasing period is started first, and then in a block for pixels on a line where the erasing period is started next. The data is thus stored in every block.

Figure 13A:
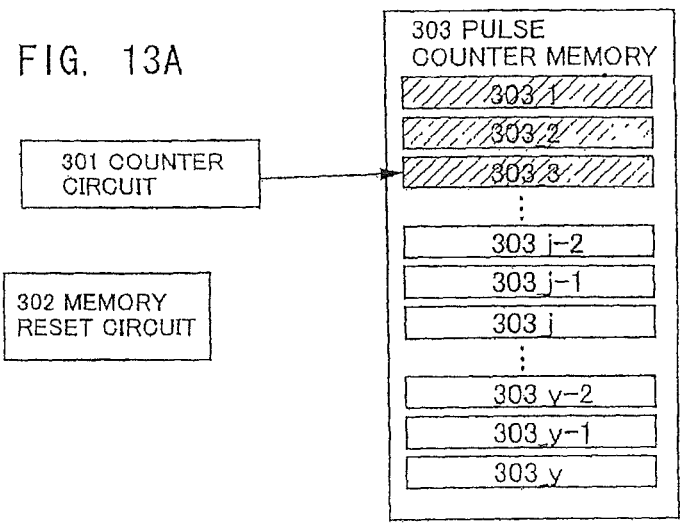
FIGS. 13A to 13C are diagrams showing the operation of a pulse counter memory.
Figure 13B:
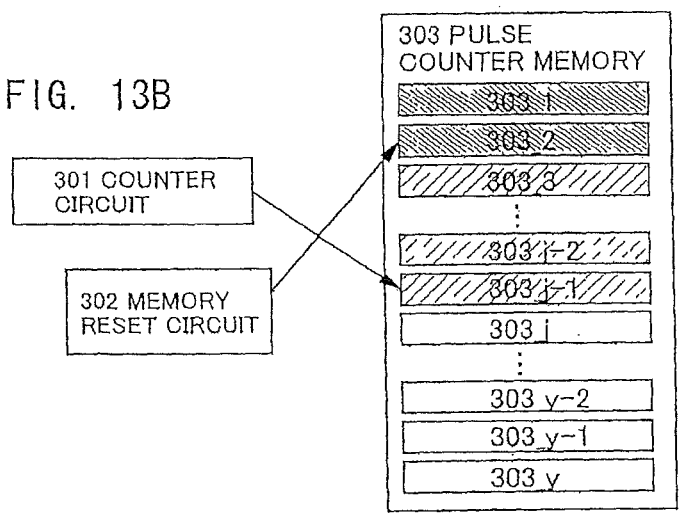
Figure 13C:
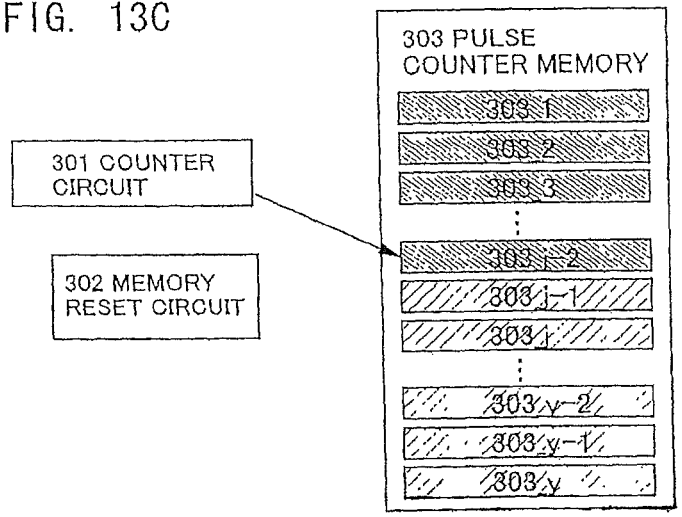

The operation of the pulse counter memory 303 when an erasing period is started will be described in detail referring to FIGS. 13A to 13C. In FIGS. 13A to 13C, j is an arbitrary number from 3 through y.

FIG. 13A shows the operation of the pulse counter memory 303 after a writing period is started and before an erasing period is started. The counter circuit 301 are inputting data that shows the number of emitting pixels to blocks, starting from a line where the writing period is started first. The inputted data are held in the blocks.

FIG. 13B shows the operation of the pulse counter memory 303 as the erasing period is started during the writing period. The counter circuit 301 are inputting data that shows the number of emitting pixels to blocks to hold the data in the blocks, starting from a line where the writing period is started first. Following this inputting operation, the data showing the number of emitting pixels and held in the blocks is rewritten and replaced by data saying the pixel number is 0 from the memory reset circuit 302. This rewrite operation is started from a line where the erasing period is started first.

FIG. 13C shows the operation of the pulse counter memory 303 after the writing period is ended and before the erasing period is ended. The data showing the number of emitting pixels and held in the blocks are being rewritten and replaced by data that says the pixel number is 0 from the memory reset circuit 302, starting from a line where the erasing period is started first.

The OLED current in each pixel is measured while pixels on any one of the lines are in display periods.

With the above structure, the correction circuit of this embodiment can calculate and compare the reference value and the measured value to adjust the correction voltage even when a display period is shorter than a writing period.

The pixel structure shown in this embodiment is merely an example, and the present invention is not limited thereto.

The structure of the correction circuit shown in this embodiment is merely an example and the present invention is not limited thereto. The only requirement of a correction circuit used in the present invention is to have the following means: means for calculating from a video signal an ideal value (reference value) for the OLED drive current flowing all or each of pixels, means for comparing a measured value with a reference value, and means for correcting the OLED drive voltage so as to reduce the difference between the measured value and the reference value if there is a certain difference therebetween.

The light emitting device having the pixel shown in this embodiment may employ the correction circuit of Embodiment 1 or 2 as it is. In this case, the current is measured while all of the pixels are in a display period and then the number of emitting pixels is calculated from video signals to make correction.

[Embodiment 5]

This embodiment describes the structure of a correction circuit when a light emitting device that has a pixel structured as shown in FIG. 4 is driven using analog video signals.

Figure 14:
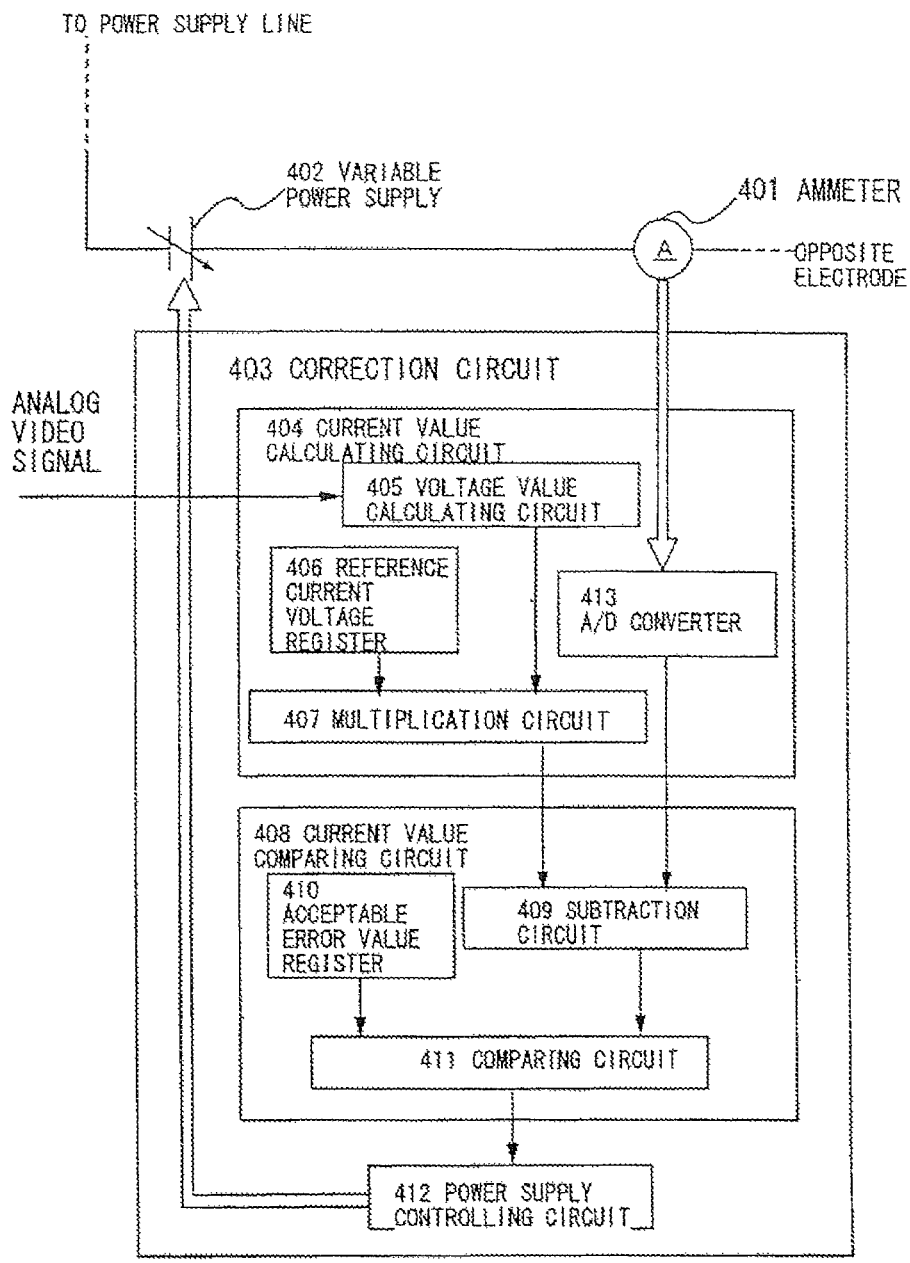
FIG. 14 is a block diagram of a correction circuit.

FIG. 14 shows in block diagram the structure of the correction circuit of this embodiment. A correction circuit 403 of this embodiment has a current value calculating circuit 404, a current value comparing circuit 408, and a power supply controlling circuit 412.

The current value calculating circuit 404 has a voltage value calculating circuit 405, a reference current voltage ratio register 406, a multiplication circuit 407, and an A/D converter circuit 413. Data of a measured value obtained by an ammeter 401 is converted into digital data by the A/D converter circuit 413 and the digital data is then inputted to the current value comparing circuit 408. If a measured value obtained by the ammeter 401 is digital data instead of analog data, the A/D converter circuit 413 is not necessary.

An analog video signal inputted to the current value calculating circuit 404 is inputted to the voltage value calculating circuit 405. The voltage value calculating circuit 405 sums up voltages of analog video signals inputted to pixels. The obtained total voltage value is sent as data to the multiplication circuit 407.

The reference current voltage ratio register 406 has stored therein an ideal OLED current value of each pixel with respect to the OLED drive voltage (voltage-current ratio). The voltage-current ratio may be a fixed data determined by design of mask or the like, or may be rewritable by a CPU, a dip switch, or the like.

The voltage-current ratio stored in the reference current voltage ratio register 410 is inputted as data to the multiplication circuit 407. The multiplication circuit 407 calculates a total reference value for the OLED drive current flowing in all of the pixels from the inputted voltage-current ratio and from the total voltage value of analog video signals inputted to pixels.

The reference value calculated by the multiplication circuit 407 is inputted as data to the current value comparing circuit 408.

The data of measured value and reference value which are inputted to the current value comparing circuit 408 are then inputted to a subtraction circuit 409. The subtraction circuit 409 calculates the difference between the inputted data of measured value and reference value (the difference is hereinafter referred to as deviation current). The deviation current calculated is inputted as data to a comparing circuit 411.

The voltage between the power supply lines V1 to Vx and the opposite electrode which is changed by correction is called a correction voltage. An acceptable error value register 410 stores a correction voltage value associated with a deviation current value. It is sufficient for deviation current and correction voltage to have a relation that makes the value of a current actually flowing in the ammeter 401 approach the reference value. For example, deviation current and correction voltage may have a linear relation or deviation current may be in proportion to the square of correction voltage.

The relation between deviation current and correction voltage, which is stored in the acceptable error value register 410, may be a fixed data determined by design of mask or the like, or may be rewritable by a CPU, a dip switch, or the like.

The comparing circuit 411 calculates the correction voltage value from the deviation current data inputted from the multiplication circuit 407 and from the relation between deviation current and correction voltage which is stored in the acceptable error value register 410. Then, the comparing circuit inputs the correction voltage value as data to the power supply controlling circuit 412.

The power supply controlling circuit 412 controls a variable power supply 402 based on the inputted correction voltage value, to thereby correct the voltage between the power supply lines V1 to Vx and the opposite electrode by the correction voltage value. With the above structure, the OLED drive voltage is corrected in the OLED 105 of each of the pixels 102 to cause a desired amount of OLED drive current to flow.

The OLED drive voltage may be corrected either by controlling the electric potential on the power supply line side or by controlling the electric potential on the opposite electrode side. Alternatively, the correction may be made by controlling both the electric potential on the power supply line side and electric potential on the opposite electrode side.

Figure 15:
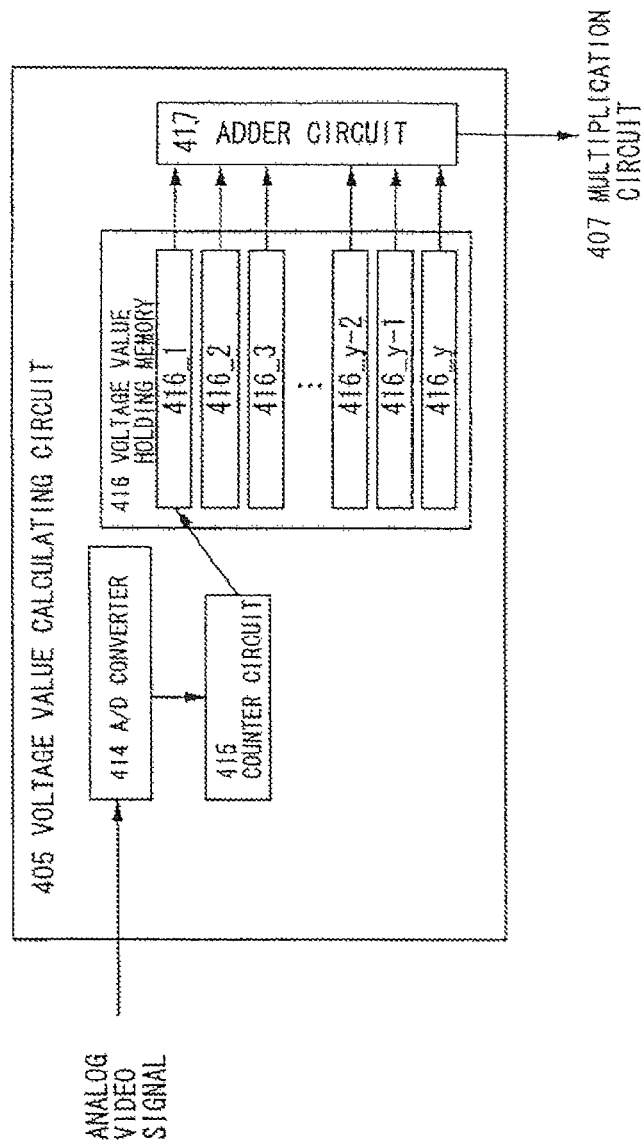
FIG. 15 is a block diagram of a voltage value calculating circuit.

A detailed structure of the voltage value calculating circuit 405 of this embodiment will be described next. FIG. 15 shows in block diagram the structure of the voltage value calculating circuit 405.

The voltage value calculating circuit 405 has an A/D converter circuit 414, a counter circuit 415, a voltage value holding memory 416, and an adder circuit 417.

The voltage value holding memory 416 is divided into sections and each section (block) stores data for pixels connected to the same gate line on each line. If there are y gate lines, the number of blocks provided has to be y or more. The blocks are numbered to match the line numbers of their associated lines and denoted by 416_1 to 416_y.

In this embodiment, analog video signals are inputted to the A/D converter circuit 414 while analog video signals are inputted to pixels. The analog video signals are inputted to the A/D converter circuit 414 one line at a time in each writing period.

For example, at the same time pixels on Line One receive analog video signals in order, analog video signals that have the same image information as the analog video signals inputted to the pixels on Line One are inputted to the A/D converter circuit 414. The difference is that a parallel processing method is used to input signals to the pixels on Line One and a serial processing method is used to input signals to the A/D converter circuit 414.

The analog video signals inputted to the A/D converter circuit 414 are converted into digital signals and the digital signals are inputted to the counter circuit 415. The analog video signals are converted into digital signals because it is easier for the memory 416 to store data in digital quantity. If the memory 416 has no difficulty in storing data in analog quantity as in a CCD or SH capacitor, there is no need for digital conversion.

The counter circuit 415 calculates the total OLED drive voltage of pixels on Line One from the inputted digital video signals. The obtained total OLED drive voltage of pixels on Line One is stored in the first block 416_1 in the voltage value holding memory 416.

Subsequently, analog video signals for pixels on Line Two to Line y are converted to digital signals by the A/D converter circuit 414 in order and the digital signals are successively inputted to the counter circuit 415. The total OLED voltage is similarly calculated for each line and the obtained total OLED voltage is stored in an associated block among the blocks 416_2 to 416_y.

As soon as the total OLED voltage is stored in a block, it is inputted to the adder circuit 417. The adder circuit 417 sums up the total OLED drive voltages inputted from the blocks to obtain the total thereof. The obtained total OLED drive voltage of all pixels is sent as data to the multiplication circuit 407.

As one frame period is ended to start inputting analog video signals of the next frame period, data of the total OLED drive voltage of the previous frame period is erased from a block to store in the block data of the total OLED drive voltage of the new frame period. This operation is started from the first block.

The OLED current in each pixel is measured while pixels on any one of the lines are in display periods.

With the above structure, the light emitting device of the present invention can keep the OLED current constant when the organic light emitting layer is degraded to prevent lowering of luminance and, as a result, can display a clear image. The light emitting device of the present invention can keep the OLED drive current constant also when there is a temperature change in the organic light emitting layer by correcting the OLED drive voltage. Therefore, the luminance can be kept constantly irrespective of temperature change and an increase in power consumption accompanying temperature rise can be prevented. Furthermore, the light emitting device of the present invention obtains the measured value and the reference value to correct the OLED current each time a new image is displayed. Therefore, a desired gray scale number is obtained for every new image through correction.

The structure of the correction circuit shown in this embodiment is merely an example and the present invention is not limited thereto. The only requirement of a correction circuit used in the present invention is to have the following means: means for calculating from a video signal an ideal value (reference value) for the OLED drive current flowing all or each of pixels, means for comparing a measured value with a reference value, and means for correcting the OLED drive voltage so as to reduce the difference between the measured value and the reference value if there is a certain difference therebetween.

In this embodiment, analog video signals inputted to the current value calculating circuit 404 are signals that have not received gamma correction yet. If analog video signals that have received gamma correction are inputted to the current value calculating circuit 404, the electric potential of the analog video signals are returned to the one prior to gamma correction before the signals are inputted to the voltage calculating circuit 405.

In this embodiment, the electric potential of analog video signals is adjusted such that the driving TFT can operate in a range where the gate voltage is substantially in proportion to the drain current.

[Embodiment 6]

In this embodiment, a detailed structure of a source line driving circuit, a gate line driving circuit, which are used for driving a pixel portion of a light emitting device of the present invention are explained.

Figure 16A:
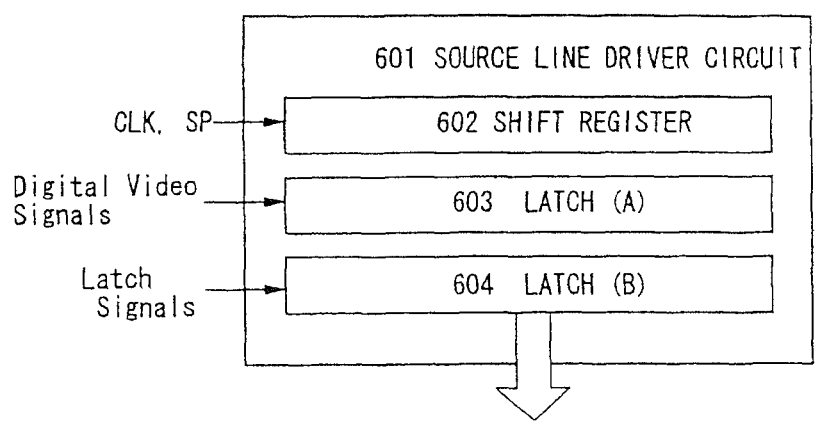
FIGS. 16A and 16B are block diagrams of driving circuits.
Figure 16B:
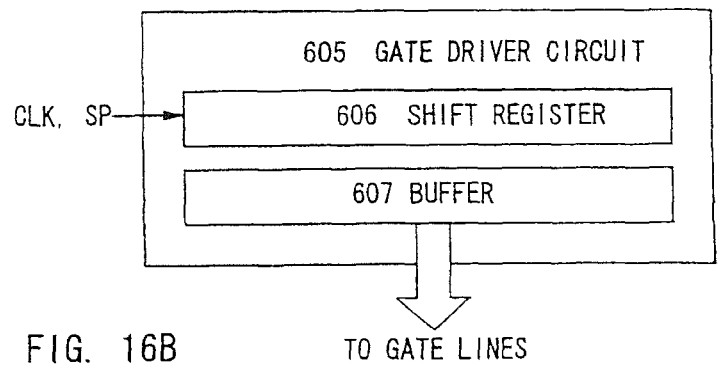

The block figure of a light emitting device of this embodiment is shown in FIGS. 16A and 16B. FIG. 16A shows the source signal line driving 601, which has a shift register 602, a latch (A) 603, and a latch (B) 604.

A clock signal CLK and a start pulse SP are input to the shift register 602 in the source signal line driving circuit 601. The shift register 602 generates timing signals in order based upon the clock signal CLK and the start pulse SP, and supplies the timing signals one after another to the subsequent stage circuit through the buffer (not illustrated) and the like.

Note that, the timing signals output from the shift register circuit 602 may be buffer amplified by a buffer and the like. The load capacitance (parasitic capacitance) of a wiring to which the timing signals are supplied is large because many of the circuits or elements are connected to the wiring. The buffer is formed in order to prevent bluntness in the rise and fall of the timing signal, generated due to the large load capacitance. In addition, the buffer is not always necessary provided.

The timing signal amplified by a buffer is inputted to the latch (A) 603. The latch (A) 603 has a plurality of latch stages for processing digital video signals. The latch (A) 603 writes in and maintains the digital video signal input from external of the source signal line driving circuit 601, when the timing signal is input.

Note that the digital video signal may also be input in order to the plurality of latch stages of the latch (A) 603 in writing in the digital video signal to the latch (A) 603. However, the present invention is not limited to this structure. The plurality of latch stages of the latch (A) 603 may be divided into a certain number of groups, and the digital video signal may be input to the respective groups at the same time in parallel, performing partitioned driving. For example, when the latches are divided into groups every four stages, it is referred to as partitioned driving with 4 divisions.

The period during which the digital video signal is completely written into all of the latch stages of the latch (A) 603 is referred to as a line period. In practice, there are cases in which the line period includes the addition of a horizontal return period to the above line period.

One line period is completed, the latch signal is inputted to the latch (B) 604. At the moment, the digital video signal written into and stored in the latch (A) 603 is sending all together to be written into and stored in all stages of the latch (B) 604.

In the latch (A) 603 after completing sending the digital video signal to the latch (B) 604, it is performed to write into the digital video signal in accordance with the timing signal from the shift register 602.

In the second ordered one line period, the digital video signal which is written into and stored in the latch (B) 604 is inputted to the source signal line.

FIG. 16B is a block figure showing the structure of gate line driving circuit.

The gate line driving circuit 605 has the shift register 606 and the buffer 607. According to circumstances, the level shift is provided.

In the address gate line driving circuit 605, the timing signal from the shift register 606 is inputted to the buffer 607, and then to a corresponding gate line. The gate electrodes of the TFTs for one line of pixels are connected to the gate lines, and all of the TFTs of the one line of pixels must be placed in an ON state simultaneously. A circuit which is capable of handling the flow of a large electric current is therefore used for the buffer.

The driving circuit shown in this embodiment is mere an example. Note that it is possible to implement Embodiment 6 in combination with Embodiments 1 to 4.

[Embodiment 7]

In this embodiment, an appearance of the light emitting device of the present invention is described with reference to FIGS. 17A to 17C.

Figure 17A:
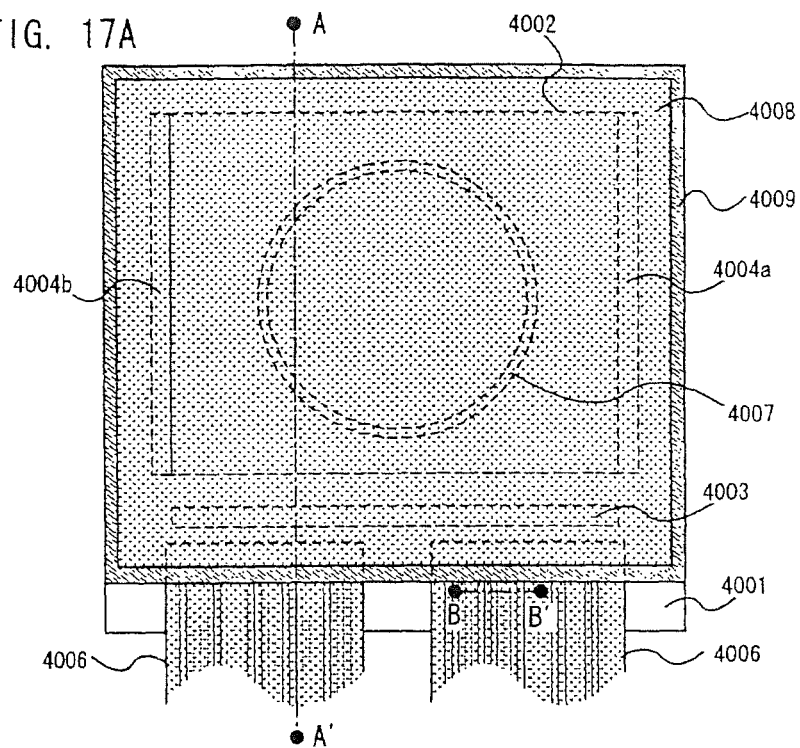
FIGS. 17A to 17C are external views of a light emitting device of the present invention.
Figure 17B:
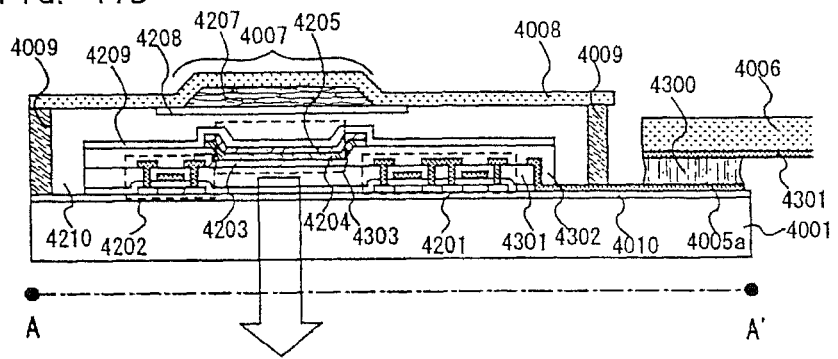
Figure 17C:
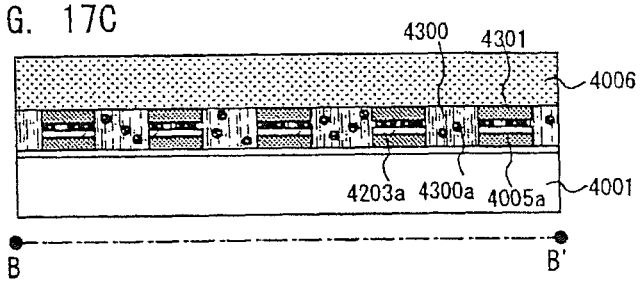

FIG. 17A is a top view of the light emitting device, FIG. 17B is a cross sectional view taken along with a line A-A' of FIG. 17A, and FIG. 17C is a cross sectional view taken along with a line B-B' of FIG. 17A.

A seal member 4009 is provided so as to surround a display pixel portion 4002, a source line driving circuit 4003 and the first and the second gate line driving circuits 4004a and 4004b, which are provided on a substrate 4001. Further, a sealing material 4008 is provided on the display pixel portion 4002, the source line driving circuit 4003 and the first and the second gate line driving circuits 4004a and 4004b. Thus, the display pixel portion 4002, the source line driving circuit 4003 and the first and the second gate line driving circuits 4004a and 4004b are sealed by the substrate 4001, the seal member 4009 and the sealing material 4008 together with a tiller 4210.

Further, the display pixel portion 4002, the monitor pixel portion 4070, the source line driving circuit 4003 and the first and the second gate line driving circuits 4004a and 4004b, which are provided on the substrate 4001, have a plurality of TFTs. In FIG. 17B, a driving circuit TFT (Here, an n-channel TFT and a p-channel TFT are shown in the figure.) 4201 included in the source line driving circuit 4003 and a driving TFT (TFT for controlling the current to the OLED) 4202 included in the display pixel portion 4002, which are formed on a base film 4010, are typically shown.

In this embodiment, the p-channel TFT or the n-channel TFT manufactured by a known method is used as the driving circuit TFT 4201, and the p-channel TFT manufactured by a known method is used as the driving TFT 4202. Further, the display pixel portion 4002 is provided with a storage capacitor (not shown) connected to a gate electrode of the driving TFT 4202.

An interlayer insulating film (leveling film) 4301 is formed on the driving circuit TFT 4201 and the driving TFT 4202, and a pixel electrode (anode) 4203 electrically connected to a drain of the driving TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light emitting layer 4204 and the cathode 4205 is formed. Further, a protective film 4209 is formed on the insulating film 4302 so as to cover the OLED 4303. The protective film 4209 is effective in preventing oxygen, moisture and the like from permeating the OLED 4303.

Reference numeral 4005a denotes a wiring drawn to be connected to the power supply line, and the wiring 4005a is electrically connected to a source region of the driving TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the tiller 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the display OLED 4303 can be suppressed by providing the hygroscopic substance or the substance that can absorb oxygen 4207.

As shown in FIG. 17C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

The ammeter, the variable power supply and the correction circuit of the light emitting device of the present invention are formed on a substrate (not shown) different from the substrate 4001, and are electrically connected to the power supply line and the cathode 4205, which are formed on the substrate 4001, through the FPC 4006.

Note that this embodiment can be implemented by being freely combined with Embodiments 1 to 6.

[Embodiment 8]

In this embodiment, an example is described in which the ammeter, the variable power supply and the correction circuit of the light emitting device of the present invention are formed on a substrate different from the substrate on which the display pixel portion is formed, and are connected to the wirings on the substrate on which the display pixel portion is formed by a means such as a wire bonding method or a COG (chip-on-glass) method.

Figure 18:
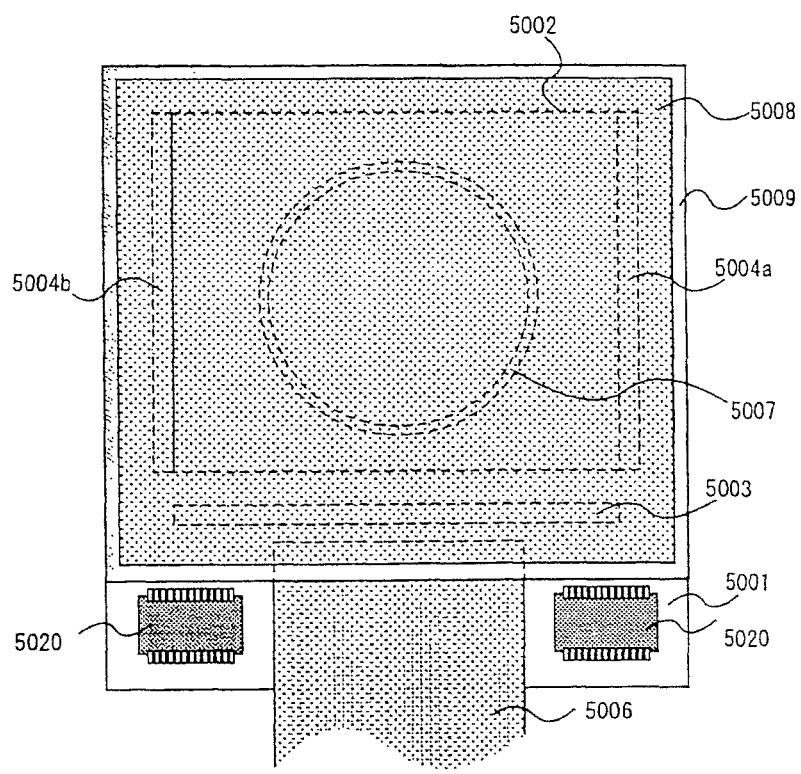
FIG. 18 is an external view of a light emitting device of the present invention.

FIG. 18 is a diagram of an appearance of a light emitting device of this embodiment. A seal member 5009 is provided so as to surround a display pixel portion 5002, a source line driving circuit 5003 and the first and the second gate line driving circuits 5004a and 5004b which are provided on a substrate 5001. Further, a sealing material 5008 is provided on the display pixel portion 5002, the source line driving circuit 5003 and the first and the second gate line driving circuits 5004a and 5004b. Thus, the display pixel portion 5002, the source line driving circuits 5003 and the first and the second gate line driving circuits 5004a and 5004b are sealed by the substrate 5001, the seal member 5009 and the sealing member 5008 together with a filler (not shown).

A concave portion 5007 is provided on the surface of the sealing material 5008 on the substrate 5001 side, and a hygroscopic substance or a substance that can absorb oxygen is arranged therein.

A wiring (drawn wiring) drawn onto the substrate 5001 passes between the seal member 5009 and the substrate 5001, and is connected to an external circuit or element of the light emitting device through an FPC 5006.

The ammeter, the variable power supply and the correction circuit of the light emitting device of the present invention are formed on a substrate (hereinafter referred to as chip) 5020 different from the substrate 5001. The chip 5020 is attached onto the substrate 5001 by the means such as the COG (chip-on-glass) method, and is electrically connected to the power supply line and a cathode (not shown) which are formed on the substrate 5001.

In this embodiment, the chip 5020 on which the ammeter, the variable power supply and the correction circuit are formed is attached onto the substrate 5001 by the wire bonding method, the COG method or the like. Thus, the light emitting device can be structured based on one substrate, and therefore, the device itself is made compact and also the mechanical strength is improved.

Note that a known method can be applied with regard to a method of connecting the chip onto the substrate. Further, circuits and elements other than the ammeter, the variable power supply and the correction circuit may be attached onto the substrate 5001.

This embodiment can be implemented by being freely combined with Embodiments 1 to 7.

[Embodiment 9]

In the present invention, an external light emitting quantum efficiency can be remarkably improved by using an organic light emitting material by which phosphorescence from a triplet exciton can be employed for emitting a light. As a result, the power consumption of the OLED can be reduced, the lifetime of the OLED can be elongated and the weight of the OLED can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

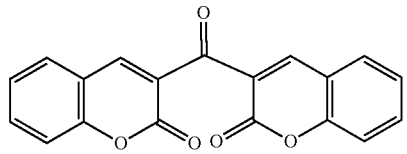

(M. A. Baldo, D. F. O'Brien, Y. You, A. Shoustikov, S. Sibley, M. E. Thompson, S. R. Forrest, Nature 395 (1998) p. 151)

The molecular formula of an organic light emitting material (Pt complex) reported by the above article is represented as follows.

(Chemical formula 2)

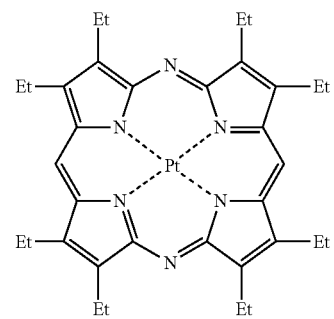

(M. A. Baldo, S. Lamansky, P. E. Burrows, M. E. Thompson, S. R. Forrest. Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys. 38 (12B) (1999) L1502)

The molecular formula of an organic light emitting material (Ir complex) reported by the above article is represented as follows.

(Chemical formula 3)

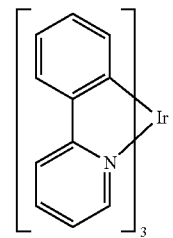

As described above, if phosphorescence from a triplet exciton can be put to practical use, it can realize the external light emitting quantum efficiency three to tour times as high as that in the case of using fluorescence from a singlet exciton in principle.

The structure according to this embodiment can be freely implemented in combination of any structures of the Embodiments 1 to 8.

[Embodiment 10]

Next, described with reference to FIGS. 20 to 23 is a method of forming the light emitting device of the present invention. Here, the method of simultaneously forming, on the same substrate, the switching TFT and the driving TFT of the pixel portion, and the TFTs of a driving portion provided surrounding the pixel portion is described in detail according to steps.

This embodiment uses a substrate 900 of a glass such as barium borosilicate glass or aluminoborosilicate glass as represented by the glass #7059 or the glass #1737 of Corning Co. There is no limitation on the substrate 900 provided it has a property of transmitting light, and there may be used a quartz substrate. There may be further used a plastic substrate having heat resistance capable of withstanding the treatment temperature of this embodiment.

Referring next to FIG. 20A, an underlying film 901 comprising an insulating film such as silicon oxide film, silicon nitride film or silicon oxynitride film is formed on the substrate 900. In this embodiment, the underlying film 901 has a two-layer structure. There, however, may be employed a structure in which a single layer or two or more layers are laminated on the insulating film. The first layer of the underlying film 901 is a silicon oxynitride film 901a formed maintaining a thickness of from 10 to 200 nm (preferably, from 50 to 100 nm) relying upon a plasma CVD method by using $SiH_4$, $NH_3$ and $N_2O$ as reaction gases. In this embodiment: the silicon oxynitride film 901a (having a composition ratio of Si=32%, O=27%, N=24%, H=17%) is formed maintaining a thickness of 50 nm. The second layer of the underlying film 901 is a silicon oxynitride film 901b formed maintaining a thickness of from 50 to 200 nm (preferably, from 100 to 150 nm) relying upon the plasma CVD method by using $SiH_4$ and $N_2O$ as reaction gases. In this embodiment, the silicon oxynitride film 901b (having a composition ratio of Si=32%, O=59%, N=7%, H=2%) is formed maintaining a thickness of 100 nm.

Then, semiconductor layers 902 to 905 are formed on the underlying film 901. The semiconductor layers 902 to 905 are formed by forming a semiconductor film having an amorphous structure by a known means (sputtering method, LPCVD method or plasma CVD method) followed by a known crystallization processing (laser crystallization method, heat crystallization method or heat crystallization method using a catalyst such as nickel), and patterning the crystalline semiconductor film thus obtained into a desired shape. The semiconductor layers 902 to 905 are formed in a thickness of from 25 to 80 nm (preferably, from 30 to 60 nm). Though there is no limitation on the material of the crystalline semiconductor film, there is preferably used silicon or a silicon germanium ($Si_xGe_{1-x}$(X=0.0001 to 0.02)) alloy. In this embodiment, the amorphous silicon film is formed maintaining a thickness of 55 nm relying on the plasma CVD method and, then, a solution containing nickel is held on the amorphous silicon film. The amorphous silicon film is dehydrogenated (500° C. one hour), heat crystallized (550° C., 4 hours) and is, further, subjected to the laser annealing to improve the crystallization, thereby to form a crystalline silicon film. The crystalline silicon film is patterned by the photolithographic method to form semiconductor layers 902 to 905.

The semiconductor layers 902 to 905 that have been formed may further be doped with trace amounts of an impurity element (boron or phosphorus) to control the threshold value of the TFT.

In forming the crystalline semiconductor film by the laser crystallization method, further, there may be employed an excimer laser of the pulse oscillation type or of the continuously light emitting type, a YAG laser or a $YVO_4$ laser. When these lasers are to be used, it is desired that a laser beam emitted from a laser oscillator is focused into a line through an optical system so as to fall on the semiconductor film. The conditions for crystallization are suitably selected by a person who carries out the process. When the excimer laser is used, the pulse oscillation frequency is set to be 300 Hz and the laser energy density to be from 100 to 400 mJ/cm² (typically, from 200 to 300 mJ/cm²). When the YAG laser is used, the pulse oscillation frequency is set to be from 30 to 300 kHz by utilizing the second harmonics and the laser energy density to be from 300 to 600 mJ/cm² (typically, from 350 to 500 mJ/cm²). The whole surface of the substrate is irradiated with the laser beam focused into a line of a width of 100 to 1000 μm, for example, 400 μm, and the overlapping ratio of the linear beam at this moment is set to be 50 to 90%.

Then, a gate insulating film 906 is formed to cover the semiconductor layers 902 to 905. The gate insulating film 906 is formed of an insulating film containing silicon maintaining a thickness of from 40 to 150 nm by the plasma CVD method or the sputtering method. In this embodiment, the gate insulating film is formed of a silicon oxynitride film (composition ratio of Si=32%, O=59%, N=7%, H=2%) maintaining a thickness of 110 nm by the plasma CVD method. The gate insulating film is not limited to the silicon oxynitride film but may have a structure on which is laminated a single layer or plural layers of an insulating film containing silicon.

When the silicon oxide film is to be formed, TEOS (tetraethyl orthosilicate) and $O_2$ are mixed together by the plasma CVD method, and are reacted together under a reaction pressure of 40 Pa, at a substrate temperature of from 300 to 400° C., at a frequency of 13.56 MHZ and a discharge electric power density of from 0.5 to 0.8 W/cm². The thus formed silicon oxide film is, then, heat annealed at 400 to 500° C. thereby to obtain the gate insulating film having good properties.

Then, a heat resistant conductive layer 907 is formed on the gate insulating film 906 maintaining a thickness of from 200 to 400 nm (preferably, from 250 to 350 nm) to form the gate electrode. The heat resistant conductive layer 907 may be formed as a single layer or may, as required, be formed in a structure of laminated layers of plural layers such as two layers or three layers. The heat resistant conductive layer contains an element selected from Ta, Ti and W, or contains an alloy of the above element, or an alloy of a combination of the above elements. The heat resistant conductive layer is formed by the sputtering method or the CVD method, and should contain impurities at a decreased concentration to decrease the resistance and should, particularly, contain oxygen at a concentration of not higher than 30 ppm. In this embodiment, the W film is formed maintaining a thickness of 300 nm. The W film may be formed by the sputtering method by using W as a target, or may be formed by the hot CVD method by using tungsten hexafluoride ($WF_6$). In either case, it is necessary to decrease the resistance so that it can be used as the gate electrode. It is, therefore, desired that the W film has a resistivity of not larger than 20 μΩcm. The resistance of the W film can be decreased by coarsening the crystalline particles. When W contains much impurity elements such as oxygen, the crystallization is impaired and the resistance increases. When the sputtering method is employed, therefore, a W target having a purity of 99.9999% is used, and the W film is formed while giving a sufficient degree of attention so that the impurities will not be infiltrated from the gaseous phase during the formation of the film, to realize the resistivity of from 9 to 20 μΩcm.

On the other hand, the Ta film that is used as the heat resistant conductive layer 907 can similarly be formed by the sputtering method. The Ta film is formed by using Ar as a sputtering gas. Further, the addition of suitable amounts of Xe and Kr into the gas during the sputtering makes it possible to relax the internal stress of the film that is formed and to prevent the film from being peeled off. The Ta film of α-phase has a resistivity of about 20 μΩcm and can be used as the gate electrode but the Ta film of β-phase has a resistivity of about 180 μΩcm and is not suited for use as the gate electrode. The TaN film has a crystalline structure close to the α-phase. Therefore, if the TaN film is formed under the Ta film, there is easily formed the Ta film of α-phase. Further, though not diagramed, formation of the silicon film doped with phosphorus (P) maintaining a thickness of about 2 to about 20 nm under the heat resistant conductive layer 907 is effective in fabricating the device. This helps improve the intimate adhesion of the conductive film formed thereon, prevent the oxidation, and prevent trace amounts of alkali metal elements contained in the heat resistant conductive layer 907 from being diffused into the gate insulating film 906 of the first shape. In any way, it is desired that the heat resistant conductive layer 907 has a resistivity over a range of from 10 to 50 μΩcm.

Next, a mask 908 is formed by a resist relying upon the photolithographic technology. Then, a first etching is executed. This embodiment uses an ICP etching device, uses $Cl_2$ and $CF_4$ as etching gases, and forms a plasma with RF (13.56 MHz) electric power of 3.2 W/cm² under a pressure of 1 Pa. The RF (13.56 MHz) electric power of 224 mW/cm² is supplied to the side of the substrate (sample stage), too, whereby a substantially negative self bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The conductive layers 909 to 912 having a first tapered shape are formed by the first etching treatment. The conductive layers 909 to 912 are tapered at an angle of from 15 to 30°. To execute the etching without leaving residue, over etching is conducted by increasing the etching time by about 10 to 20%. The selection ratio of the silicon oxynitride film (gate insulating film 906) to the W film is 2 to 4 (typically, 3). Due to the over etching, therefore, the surface where the silicon oxynitride film is exposed is etched by about 20 to about 50 nm (FIG. 20B).

Then, a first doping treatment is effected to add an impurity element of a first type of electric conduction to the semiconductor layer. Here, a step is conducted to add an impurity element for imparting the n-type. A mask 908 forming the conductive layer of a first shape is left, and an impurity element is added by the ion doping method to impart the n-type in a self-aligned manner with the conductive layers 909 to 912 having a first tapered shape as masks. The dosage is set to be from $1\times10^{13}$ to $5\times10^{14}$ atoms/cm² so that the impurity element for imparting the n-type reaches the underlying semiconductor layer penetrating through the tapered portion and the gate insulating film 906 at the ends of the gate electrode, and the acceleration voltage is selected to be from 80 to 160 keV. As the impurity element for imparting the n-type, there is used an element belonging to the Group 15 and, typically, phosphorus (P) or arsenic (As), Phosphorus (P) is used, here. Due to the ion doping method, an impurity element for imparting the n-type is added to the first impurity regions 914 to 917 over a concentration range of from $1\times10^{20}$ to $1\times10^{21}$ atoms/cm (FIG. 20C).

In this step, the impurities turn down to the lower side of the conductive layers 909 to 912 of the first shape depending upon the doping conditions, and it often happens that the first impurity regions 914 to 917 are overlapped on the conductive layers 909 to 912 of the first shape.

Next, the second etching treatment is conducted as shown in FIG. 20D. The etching treatment, too, is conducted by using the ICP etching device, using a mixed gas of $CF_4$ and $Cl_2$ as an etching gas, using an RF electric power of 3.2 W/cm² (13.56 MHz), a bias power of 45 mW/cm² (13.56 MHz) under a pressure of 1.0 Pa. Under this condition, there are formed the conductive layers 918 to 921 of a second shape. The end portions thereof are tapered, and the thicknesses gradually increase from the ends toward the inside. The rate of isotropic etching increases in proportion to a decrease in the bias voltage applied to the side of the substrate as compared to the first etching treatment, and the angle of the tapered portions becomes 30 to 60°. The mask 908 is ground at the edge by etching to form a mask 922. In the step of FIG. 20D, the surface of the gate insulating film 906 is etched by about 40 nm.

Then, the doping is effected with an impurity element for imparting the n-type under the condition of an increased acceleration voltage by decreasing the dosage to be smaller than that of the first doping treatment. For example, the acceleration voltage is set to be from 70 to 120 keV, the dosage is set to be $1\times10^{13}$/cm² thereby to form first impurity regions 924 to 927 having an increased impurity concentration, and second impurity regions 928 to 931 that are in contact with the first impurity regions 924 to 927. In this step, the impurity may turn down to the lower side of the conductive layers 918 to 921 of the second shape, and the second impurity regions 928 to 931 may be overlapped on the conductive layers 918 to 921 of the second shape. The impurity concentration in the second impurity regions is from $1\times10^{16}$ to $1\times10^{18}$ atoms/cm³ (FIG. 21A).

Referring to FIG. 21B, impurity regions 933 (933a, 933b) and 934 (934a, 934b) of the conduction type opposite to the one conduction type are formed in the semiconductor layers 902, 905 that form the p-channel TFTs. In this case, too, an impurity element for imparting the p-type is added using the conductive layers 918. 921 of the second shape as masks to form impurity regions in a self-aligned manner. At this moment, the semiconductor layers 903 and 904 forming the n-channel TFTs are entirely covered for their surfaces by forming a mask 932 of a resist. Here, the impurity regions 933 and 934 are formed by the ion-doping method by using diborane ($B_2H_6$). The impurity element for imparting the p-type is added to the impurity regions 933 and 934 at a concentration of from $2\times10^{20}$ to $2\times10^{21}$ atoms/cm³.

If closely considered, however, the impurity regions 933, 934 can be divided into two regions containing an impurity element that imparts the n-type. Third impurity regions 933a and 934a contain the impurity element that imparts the n-type at a concentration of from $1\times10^{20}$ to $1\times10^{21}$ atoms/cm³ and fourth impurity regions 933b and 934b contain the impurity element that imparts the n-type at a concentration of from $1\times10^{17}$ to $1\times10^{20}$ atoms/cm³. In the impurity regions 933b and 934b, however, the impurity element for imparting the p-type is contained at a concentration of not smaller than $1\times10^{19}$ atoms/cm³ and in the third impurity regions 933a and 934a, the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem.

Referring next to FIG. 21C, a first interlayer insulating film 937 is formed on the conductive layers 918 to 921 of the second shape and on the gate insulating film 906. The first interlayer insulating film 937 may be formed of a silicon oxide film, a silicon oxynitride film, a silicon nitride film, or a laminated layer film of a combination thereof. In any case, the first interlayer insulating film 937 is formed of an inorganic insulating material. The first interlayer insulating film 937 has a thickness of 100 to 200 nm. When the silicon oxide film is used as the first interlayer insulating film 937. TEOS and $O_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm². When the silicon oxynitride film is used as the first interlayer insulating film 937, this silicon oxynitride film may be formed from $SiH_4$, $N_2O$ and $NH_3$, or from $SiH_4$ to and $N_2O$ by the plasma CVD method. The conditions of formation in this case are a reaction pressure of from 20 to 200 Pa, a substrate temperature of from 300 to 400° C. and a high frequency (60 MHz) power density of from 0.1 to 1.0 W/cm². As the first interlayer insulating film 937, further, there may be used a hydrogenated silicon oxynitride film formed by using $SiH_4$, $N_2O$ and $H_2$. The silicon nitride film, too, can similarly be formed by using $SiH_4$ and $NH_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this embodiment, the heat treatment is conducted at 550° C. for 4 hours. When a plastic substrate having a low heat resistance temperature is used as the substrate 501, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}/cm^3$ in the semiconductor layer with hydrogen that is thermally excited. As another means of hydrogenation, the plasma hydrogenation may be executed (using hydrogen excited with plasma). In any way, it is desired that the defect density in the semiconductor layers 902 to 905 is suppressed to be not larger than $10^{16}$ cm³. For this purpose, hydrogen may be added in an amount of from 0.01 to 0.1 atomic %.

Then, a second interlayer insulating film 939 of an organic insulating material is formed maintaining an average thickness of from 1.0 to 2.0 µm. As the organic resin material, there can be used polyimide, acrylic resin, polyamide, polyimide-amide, BCB (benzocyclobutene). When there is used, for example, a polyimide of the type that is heat polymerized after being applied onto the substrate, the second interlayer insulating film is formed being fired in a clean oven at 300° C. When there is used an acrylic resin, there is used the one of the two-can type. Namely, the main material and a curing agent are mixed together, applied onto the whole surface of the substrate by using a spinner, pre-heated by using a hot plate at 80° C. for 60 seconds, and are tired at 250° C. for 60 minutes in a clean oven to form the second interlayer insulating film.

Thus, the second interlayer insulating film 939 is formed by using an organic insulating material featuring good and flattened surface. Further, the organic resin material, in general, has a small dielectric constant and lowers the parasitic capacitance. The organic resin material, however, is hygroscopic and is not suited as a protection film. It is, therefore, desired that the second interlayer insulating film is used in combination with the silicon oxide film, silicon oxynitride film or silicon nitride film formed as the first interlayer insulating film 937.

Thereafter, the resist mask of a predetermined pattern is formed, and contact holes are formed in the semiconductor layers to reach the impurity regions serving as source regions or drain regions. The contact holes are formed by dry etching. In this case, a mixed gas of $CF_4$, $O_2$ and He is used as the etching gas to first, etch the second interlayer insulating film 939 of the organic resin material. Thereafter, $CF_4$ and $O_2$ are used as the etching gas to etch the first interlayer insulating film 937. In order to further enhance the selection ratio relative to the semiconductor layer. $CHF_3$ is used as the etching gas to etch the gate insulating film 570 of the third shape, thereby to form the contact holes.

Here, the conductive metal film is formed by sputtering and vacuum vaporization and is patterned by using a mask and is, then, etched to form source wirings 940 to 943, drain wirings 944 to 946. Further, though not diagramed in this embodiment, the wiring is formed by a laminate of a 50 nm thick Ti film and a 500 nm thick alloy film (alloy film of Al and Ti).

Figure 22A:
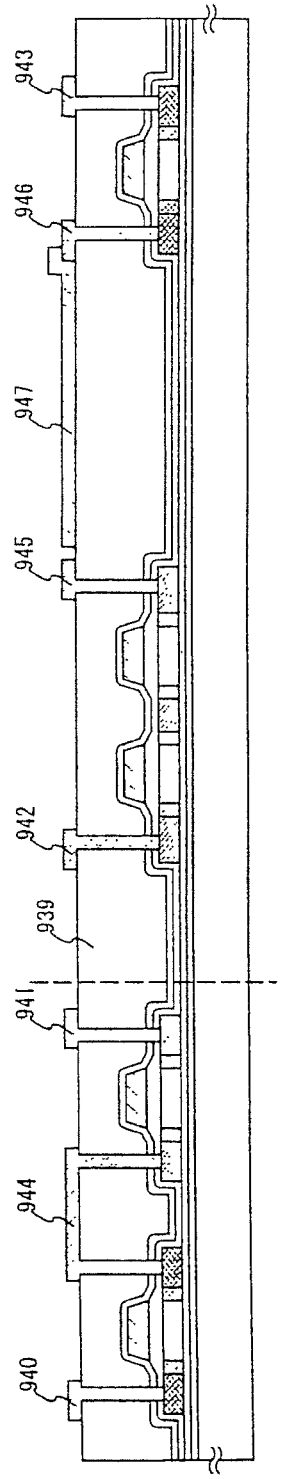
FIGS. 22A and 22B are diagrams showing a method of manufacturing a light emitting device according to the present invention.

Then, a transparent conductive film is formed thereon maintaining a thickness of 80 to 120 nm, and is patterned to form a pixel electrode 947 (FIG. 22A). Therefore, the pixel electrode 947 is formed by using an indium oxide-tin (ITO) film as a transparent electrode or a transparent conductive film obtained by mixing 2 to 20% of a zinc oxide (ZnO) into indium oxide.

Further, the pixel electrode 947 is formed being in contact with, and overlapped on, the drain wiring 946 that is electrically connected to the drain region of the driving TFT.

Figure 22B:
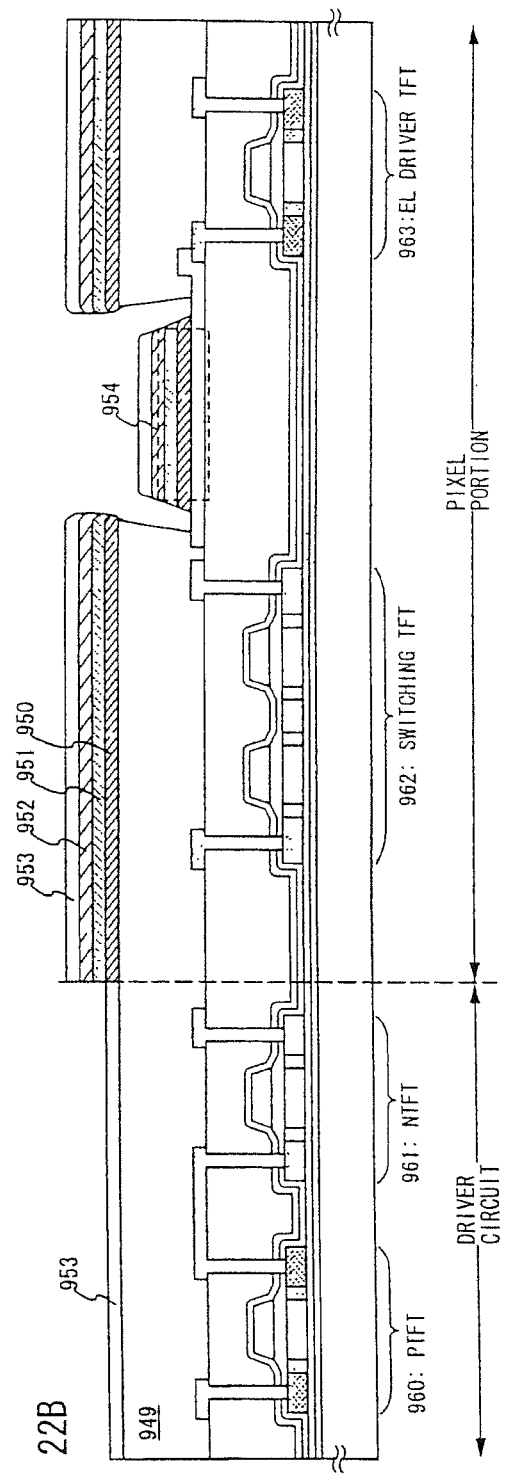

Next, a third interlayer insulating film 949 having an opening at the position that coincides with the pixel electrode 947 is formed as shown in FIG. 22B. The third interlayer insulating film 949 is capable of insulating, and functions as a bank to separate organic light emitting layers of adjacent pixels from one another. In this embodiment, a resist is used to form the third interlayer insulating film 949.

In this embodiment, the third interlayer insulating film 949 is about 1 µm in thickness and the aperture is shaped to have a so-called reverse tapered shape in which the width is increased toward the pixel electrode 947. This is obtained by covering the resist film with a mask except the portion where the aperture is to be formed, exposing the film through irradiation of UV light, and then removing the exposed portion using a developer.

The third interlayer insulating film 949 reversely tapered as in this embodiment separates organic light emitting layers of adjacent pixels from each other when the organic light emitting layers are formed in a later step. Therefore cracking or peeling of the organic light emitting layers can be prevented even if the organic light emitting layers and the third interlayer insulating film 949 have different thermal expansion coefficient.

Although a resist film is used in this embodiment for the third interlayer insulating film, polyimide, polyamide, acrylic, BCB (benzocycrobutene), or silicon oxide film may be used in some cases. The third interlayer insulating film 949 may be organic or inorganic as long as the material is capable of insulating.

An organic light emitting layer 950 is formed by evaporation. A cathode (MgAg electrode) 951 and a protective electrode 952 are also formed by evaporation. Desirably, heat treatment is performed on the pixel electrode 947 to remove moisture completely from the electrode before forming the organic light emitting layer 950 and the cathode 951. Though the cathode of OLED is an MgAg electrode in this embodiment, other known materials may be used instead.

The organic light emitting layer 950 can be formed from a known material. In this embodiment, the organic light emitting layer has a two-layer structure consisting of a hole transporting layer and a light emitting layer. The organic light emitting layer may additionally have a hole injection layer, an electron injection layer, or an electron transporting layer. Various combinations of these layers have been reported and any of them can be used.

In this embodiment, the hole transporting layer is polyphenylene vinylene deposited by evaporation. The light emitting layer is obtained by evaporation of polyvinyl carbazole with molecular dispersion of 30 to 40% of PBD that is a 1,3,4-oxadiazole derivative and by doping the resultant film with about 1% of coumarine 6 as green color luminescent center.

The protective electrode 952 alone can protect the organic light emitting layer 950 from moisture and oxygen but adding a protective film 953 is more desirable. The protective film 953 in this embodiment is a silicon nitride film with a thickness of 300 nm. The protective electrode 952 and the protective film may be formed in succession without exposing the substrate to the air.

The protective electrode 952 also prevents degradation of the cathode 951. Typically, a metal film containing aluminum as its main ingredient is used for the protective electrode. Other materials may of course be used. The organic light emitting layer 950 and the cathode 951 are very weak against moisture. Therefore it is desirable to form them and the protective electrode 952 in succession without exposing the substrate to the air to protect them from the outside air.

The organic light emitting layer 950 is 10 to 400 nm in thickness (typically 60 to 150 nm). The cathode 951 is 80 to 200 nm in thickness (typically 100 to 150 nm).

Thus completed is a light emitting device structured as shown in FIG. 22B. A portion 954 where the pixel electrode 947, the organic light emitting layer 950, and the cathode 951 overlap corresponds to the OLED.

A p-channel TFT 960 and an n-channel TFT 961 are TFTs of the driving circuit and constitute a CMOS. A switching TFT 962 and a driving TFT 963 are TFTs of the pixel portion. The TFTs of the driving circuit and the TFTs of the pixel portion can be formed on the same substrate.

In the case of a light emitting device using OLED, its driving circuit can be operated by a power supply having a voltage of 5 to 6V, 10 V, at most. Therefore, degradation of TFTs due to hot electron is not a serious problem. Also, smaller gate capacitance is preferred for the TFTs since the driving circuit needs to operate at high speed. Accordingly, in a driving circuit of a light emitting device using OLED as in this embodiment, the second impurity region 929 and the fourth impurity region 933*b* of the semiconductor layers of the TFTs preferably do not overlap the gate electrode 918 and the gate electrode 919, respectively.

The method of manufacturing the light emitting device of the present invention is not limited to the one described in this embodiment. The light emitting device of the present invention may be manufactured by a known method.

This embodiment may be combined freely with Embodiments 1 through 9.

[Embodiment 11]

In this embodiment, a method of manufacturing a light emitting device different from that in Embodiment 10 is described.

The process through the formation of the second interlayer insulating film 939 is the same as in Embodiment 5. As shown in FIG. 23A, after the second interlayer insulating film 939 is formed, a passivation film 939 is formed so as to contact the second interlayer insulating film 939.

The passivation film 939 is effective in preventing moisture contained in the second interlayer insulating film 939 from permeating the organic light emitting layer 950 through the pixel electrode 947 or a third interlayer insulating film 982. In the case where the second interlayer insulating film 939 includes an organic resin material, it is particularly effective to provide the passivation film 939 since the organic resin material contains a large amount of moisture.

In this embodiment, a silicon nitride film is used as the passivation film 939.

Thereafter, a resist mask having a predetermined pattern is formed, and contact holes reaching impurity regions, which are source regions or drain regions, are formed in the respective semiconductor layers. The contact holes are formed by a dry etching method. In this case, the second interlayer insulating film 939 comprised of the organic resin material is first etched by using a gas mixture of $CF_4$, $O_2$ and He as an etching gas. Subsequently, the first interlayer insulating film 937 is etched with CF and $O_2$ as an etching gas. Further, in order to raise a selection ratio with the semiconductor layer, the etching gas is changed to CHF to etch the third shape gate insulating film 570, whereby the contact holes can be formed.

Then, a conductive metal film is formed by a sputtering method or a vacuum evaporation method, patterning is performed with a mask, and thereafter, etching is performed. Thus, the source wirings 940 to 943 and the drain wirings 944 to 946 are formed. Although not shown, the wirings are formed of a lamination film of a Ti film with a thickness of 50 nm and an alloy film with a thickness of 500 nm (alloy film of Al and Ti) in this embodiment.

Subsequently, a transparent conductive film is formed thereon with a thickness of 80 to 120 nm, and the pixel electrode 947 is formed by patterning (FIG. 23A). Note that an indium-tin oxide (ITO) film or a transparent conductive film in which indium oxide is mixed with 2 to 20% of zinc oxide (ZnO) is used for a transparent electrode in this embodiment.

Further, the pixel electrode 947 is formed so as to contact and overlap the drain wiring 946. Thus, electrical connection between the pixel electrode 947 and the drain region of the driving TFT is formed.

Next, as shown in FIG. 23B, the third interlayer insulating film 982 having an opening portion at the position corresponding to the pixel electrode 947 is formed. In this embodiment, side walls having a tapered shape are formed by using a wet etching method in forming the opening portion. Differently from the case shown in Embodiment 5, the organic light emitting layer formed on the third interlayer insulating film 982 is not separated. Thus, the deterioration of the organic light emitting layer which derives from a step becomes a conspicuous problem if the side walls of the opening portion are not sufficiently gentle, which requires attention.

Note that although a film made of silicon oxide is used as the third interlayer insulating film 982 in this embodiment, an organic resin film such as polyimide, polyamide, acrylic or BCB (benzocyclobutene) may also be used depending on circumstances.

Then, it is preferable that, before the organic light emitting layer 950 is formed on the third interlayer insulating film 982, plasma processing using argon is conducted to the surface of the third interlayer insulating film 982 to make close the surface of the third interlayer insulating film 982. With the above structure, it is possible to prevent moisture from permeating the organic light emitting layer 950 from the third interlayer insulating film 982.

Next, the organic light emitting layer 950 is formed by an evaporation method, and further, the cathode (MgAg electrode) 951 and the protecting electrode 952 are formed by the evaporation method. At this time, it is desirable that heat treatment is conducted to the pixel electrode 947 to completely remove moisture prior to the formation of the organic light emitting layer 950 and the cathode 951. Note that, the MgAg electrode is used as the cathode of the OLED in this embodiment, but other known materials may also be used.

Note that a known material can be used for the organic light emitting layer 950. In this embodiment, the organic light emitting layer takes a two-layer structure constituted of a hole transporting layer and an emitting layer. However, there may be a case where any one of a hole injecting layer, an electron injecting layer and an electron transporting layer is included in the organic light emitting layer. Various examples of combinations have been reported as described above, and any structure among those may be used.

In this embodiment, polyphenylene vinylene is formed by the evaporation method for forming the hole transporting layer. Further, polyvinylcarbazole dispersed with PBD of 1,3,4-oxadiazole derivative with 30 to 40% molecules is formed by the evaporation method for forming the light emitting layer, and about 1% of coumarin 6 is added thereto as the emission center of green color.

Further, it is possible to protect the organic light emitting layer 950 from moisture and oxygen in the protecting electrode 952, but the protective film 953 may be, more preferably, provided. In this embodiment, a silicon nitride film with a thickness of 300 nm is provided as the protective film 953. This protective film may be continuously formed without exposure to an atmosphere after the formation of the protecting electrode 952.

Moreover, the protecting electrode 952 is provided for preventing deterioration of the cathode 951 and is typified by a metal film containing aluminum as its main constituent. Of course, other materials may also be used. Further, since the organic light emitting layer 950 and the cathode 951 are extremely easily affected by moisture, it is desirable that the formation is continuously performed through the formation of the protecting electrode 952 without exposure to an atmosphere to thereby protect the organic light emitting layer against an outer atmosphere.

Note that the thickness of the organic light emitting layer 950 may be 10 to 400 nm (typically, 60 to 150 nm) and the thickness of the cathode 951 may be 80 to 200 nm (typically, 100 to 150 nm).

Thus, the light emitting device with the structure as shown in FIG. 23B is completed. Note that the portion 954, where the pixel electrode 947, the organic light emitting layer 950 and the cathode 951 are overlapped one another, corresponds to the OLED.

The p-channel TFT 960 and the n-channel TFT 961 are the TFTs of the driving circuit, and form a CMOS. The switching TFT 962 and the driving TFT 963 are the TFTs of the pixel portion. The TFTs of the driving circuit and the TFTs of the pixel portion can be formed on the same substrate.

The method of manufacturing the light emitting device of the present invention is not limited to the manufacturing method described in this embodiment. The light emitting device of the present invention can be manufactured by using a known method.

Note that this embodiment can be implemented by freely being combined with Embodiments 1 to 9.

[Embodiment 12]

The light emitting device is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices.

Such electronic devices using a light emitting device of the present invention include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 24 respectively shows various specific examples of such electronic devices.

FIG. 24A illustrates an organic light emitting display device which includes a casing 2001, a support table 2002, a display portion 2003, a speaker portion 2004, a video input terminal 2005 or the like. The present invention is applicable to the display portion 2003. The light emitting device is of the self-emission type and therefore requires no back light. Thus, the display portion thereof can have a thickness thinner than that of the liquid crystal display device. The organic light emitting display device is including the entire display device for displaying information, such as a personal computer, a receiver of TV broadcasting and an advertising display.

FIG. 24B illustrated a digital still camera which includes a main body 2101, a display portion 2102, an image receiving portion 2103, an operation key 2104, an external connection port 2105, a shutter 2106, or the like. The light emitting device in accordance with the present invention can be used as the display portion 2102.

FIG. 24C illustrates a laptop computer which includes a main body 2201, a casing 2202, a display portion 2203, a keyboard 2204, an external connection port 2205, a pointing mouse 2206, or the like. The light emitting device in accordance with the present invention can be used as the display portion 2203.

FIG. 24D illustrated a mobile computer which includes a main body 2301, a display portion 2302, a switch 2303, an operation key 2304, an infrared port 2305, or the like. The light emitting device in accordance with the present invention can be used as the display portion 2302.

FIG. 24E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light emitting device in accordance with the present invention can be used as these display portions A and B. The image reproduction apparatus including a recording medium further includes a game machine or the like.

FIG. 24F illustrates a goggle type display (head mounted display) which includes a main body 2501, a display portion 2502, an arm portion 2503. The light emitting device in accordance with the present invention can be used as the display portion 2502.

FIG. 24G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light emitting device in accordance with the present invention can be used as the display portion 2602.

FIG. 24H illustrates a mobile phone which includes a main body 2701, a casing 2702, a display portion 2703, a sound input portion 2704, a sound output portion 2705, an operation key 2706, an external connecting port 2707, an antenna 2708, or the like. The light emitting device in accordance with the present invention can be used as the display portion 2703. Note that the display portion 2703 can reduce power consumption of the portable telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a light emitting device having the configuration in which the structures in Embodiments 1 through 11 are freely combined.

With the above structure, the present invention can control lowering of OLED luminance when the organic light emitting layer is degraded and, as a result, can display a clear image. If the light emitting device is to display in color using OLEDs of a plurality of colors, the luminance of light of a plurality of colors can be kept balanced and images can be displayed in desired colors even when the rate of degradation of organic light emitting layer varies between OLEDs of a plurality of colors.

The present invention can also prevent a change in OLED luminance when the temperature of the organic light emitting layer is influenced by the outside temperature or by heat generated from the OLED panel itself, as well as an increase in power consumption which accompanies temperature rise. If the light emitting device is a color display device, changes in luminance of OLEDs of a plurality of colors can be prevented irrespective of temperature change and therefore the luminance of light of a plurality of colors can be kept balanced and images can be displayed in desired colors. Data can be processed either in digital quantity or analog quantity in circuits of each of the correction circuits shown in this specification. Which circuit is to be placed upstream of the A/D converter circuit or D/A converter circuit is within designer's discretion.

What is claimed is:

1. A light-emitting device comprising:
a pixel portion comprising a plurality of pixels;
an ammeter configured to measure a first current value flowing into the plurality of pixels;
a variable power supply configured to supply the plurality of pixels with a voltage; and
a correction circuit,
wherein:
the correction circuit is configured to calculate a second current value flowing into one of the plurality of pixels based on a video signal and the first current value,
the correction circuit is configured to calculate a deviation current between the second current value and a reference value, the reference value being calculated based on the video signal,
the correction circuit is configured to store a range of the deviation current,
the correction circuit is configured to output a correction voltage when the deviation current is outside the range and not to output the correction voltage when the deviation current is within the range,
the correction circuit is configured to control the variable power supply based on the correction voltage.

2. The light-emitting device according to claim 1, wherein the correction circuit is configured to calculate the reference value each time a new image is displayed.

3. The light-emitting device according to claim 1, wherein the range of the deviation current is a fixed data determined by a design of mask, or a rewritable data by a CPU.

4. The light-emitting device according to claim 1, wherein the ammeter, the variable power supply, and the correction circuit is provided for each colors of the pixel portion.

5. The light-emitting device according to claim 2, wherein the ammeter, the variable power supply, and the correction circuit is provided on a substrate different from a substrate on which the pixel portion is provided.

6. An electronic device comprising a display portion including the light-emitting device according to claim 1.

7. A light-emitting device comprising:
a pixel portion comprising a plurality of pixels;
an ammeter configured to measure a first current value flowing into the plurality of pixels;
a variable power supply configured to supply the plurality of pixels with a voltage; and
a correction circuit,
wherein:
the correction circuit is configured to calculate a number of the plurality of pixels which are emitting light from a video signal,
the correction circuit is configured to calculate a second current value flowing into one of the plurality of pixels from the first current value and the number of the plurality of pixels which are emitting light,
the correction circuit is configured to calculate a deviation current between the second current value and a reference value, the reference value being calculated based on the video signal,
the correction circuit is configured to store a range of the deviation current,
the correction circuit is configured to output a correction voltage when the deviation current is outside the range and not to output the correction voltage when the deviation current is within the range,
the correction circuit is configured to control the variable power supply based on the correction voltage.

8. The light-emitting device according to claim 7, wherein the correction circuit is configured to calculate the reference value each time a new image is displayed.

9. The light-emitting device according to claim 7, wherein the range of the deviation current is a fixed data determined by a design of mask, or a rewritable data by a CPU.

10. The light-emitting device according to claim 7, wherein the ammeter, the variable power supply, and the correction circuit is provided for each colors of the pixel portion.

11. The light-emitting device according to claim 7, wherein the ammeter, the variable power supply, and the correction circuit is provided on a substrate different from a substrate on which the pixel portion is provided.

12. An electronic device comprising a display portion including the light-emitting device according to claim 7.

13. A light-emitting device comprising:
a pixel portion comprising a plurality of pixels;
an ammeter configured to measure a first current value flowing into the plurality of pixels;
a variable power supply configured to supply the plurality of pixels with a voltage; and
a correction circuit,
wherein:
the correction circuit is configured to calculate a number of the plurality of pixels which are emitting light from a video signal,
the correction circuit is configured to calculate a total reference value for all of the plurality of pixels from a reference value and the number of the plurality of pixels which are emitting light, the reference value being calculated based on the video signal,
the correction circuit is configured to calculate a deviation current between the first current value and the total reference value,
the correction circuit is configured to store a range of the deviation current,
the correction circuit is configured to output a correction voltage when the deviation current is outside the range and not to output the correction voltage when the deviation current is within the range,
the correction circuit is configured to control the variable power supply based on the correction voltage.

14. The light-emitting device according to claim 13, wherein the correction circuit is configured to calculate the reference value each time a new image is displayed.

15. The light-emitting device according to claim 13, wherein the range of the deviation current is a fixed data determined by a design of mask, or a rewritable data by a CPU.

16. The light-emitting device according to claim 13, wherein the ammeter, the variable power supply, and the correction circuit is provided for each colors of the pixel portion.

17. The light-emitting device according to claim 13, wherein the ammeter, the variable power supply, and the correction circuit is provided on a substrate different from a substrate on which the pixel portion is provided.

18. An electronic device comprising a display portion including the light-emitting device according to claim 13.

* * * * *